US009666289B2

(12) United States Patent
Lee et al.

(10) Patent No.: US 9,666,289 B2
(45) Date of Patent: May 30, 2017

(54) SEMICONDUCTOR DEVICE INCLUDING CELL REGION STACKED ON PERIPHERAL REGION AND METHOD OF FABRICATING THE SAME

(71) Applicant: SAMSUNG ELECTRONICS CO., LTD., Suwon-si, Gyeonggi-do (KR)

(72) Inventors: Jae-Eun Lee, Hwaseong-si (KR); Sunghoon Kim, Seongnam-si (KR)

(73) Assignee: SAMSUNG ELECTRONICS CO., LTD., Suwon-si, Gyonggi-Do (KR)

( * ) Notice: Subject to any disclaimer, the term of this patent is extended or adjusted under 35 U.S.C. 154(b) by 0 days.

(21) Appl. No.: 15/049,526

(22) Filed: Feb. 22, 2016

(65) Prior Publication Data

US 2016/0307632 A1    Oct. 20, 2016

(30) Foreign Application Priority Data

Apr. 16, 2015 (KR) .................. 10-2015-0053885

(51) Int. Cl.
| | |
|---|---|
| G11C 16/06 | (2006.01) |
| H01L 27/115 | (2006.01) |
| G11C 16/14 | (2006.01) |
| H01L 27/11526 | (2017.01) |
| H01L 27/11556 | (2017.01) |
| H01L 27/11573 | (2017.01) |
| H01L 27/11582 | (2017.01) |
| H01L 23/528 | (2006.01) |
| H01L 23/522 | (2006.01) |
| H01L 23/532 | (2006.01) |

(Continued)

(52) U.S. Cl.
CPC .............. *G11C 16/14* (2013.01); *G11C 5/025* (2013.01); *H01L 21/768* (2013.01); *H01L 23/5226* (2013.01); *H01L 23/5286* (2013.01); *H01L 23/53271* (2013.01); *H01L 27/11526* (2013.01); *H01L 27/11556* (2013.01); *H01L 27/11573* (2013.01); *H01L 27/11582* (2013.01); *G11C 16/0483* (2013.01)

(58) Field of Classification Search
CPC ........... G11C 16/14; G11C 16/16; G11C 5/25; H01L 23/5226; H01L 23/5286; H01L 27/11526; H01L 27/11529; H01L 27/11548; H01L 27/11573; H01L 27/11575

See application file for complete search history.

(56) References Cited

U.S. PATENT DOCUMENTS 6,351,406 B1    2/2002    Johnson et al.
6,483,176 B2    11/2002   Noguchi et al.
(Continued)

*Primary Examiner* — Allison P Bernstein
(74) *Attorney, Agent, or Firm* — F. Chau & Assocates, LLC

(57) ABSTRACT

Provided are semiconductor devices including a peripheral region and a cell region stacked thereon and a method of fabricating the same. The semiconductor device may include a peripheral region including a lower substrate and a peripheral circuit provided thereon and a cell region including an upper substrate and a cell array provided thereon. The cell region may be stacked on the peripheral region. When an operation signal is applied to the cell region from the peripheral region, at least a portion of the peripheral and cell regions may be used as a ground pattern applied with a ground signal, thereby being in an electrical ground state.

41 Claims, 21 Drawing Sheets

(51) Int. Cl.
*H01L 21/768* (2006.01)
*G11C 5/02* (2006.01)
*G11C 16/04* (2006.01)

(56) References Cited

U.S. PATENT DOCUMENTS

| | | | |
|---|---|---|---|
| 6,839,260 B2 | 1/2005 | Ishii | |
| 7,812,390 B2 | 10/2010 | Park et al. | |
| 7,910,432 B2* | 3/2011 | Tanaka | H01L 27/11578 |
| | | | 257/324 |
| 8,107,286 B2 | 1/2012 | Itagaki et al. | |
| 8,234,680 B2 | 7/2012 | Da Palma et al. | |
| 8,288,816 B2* | 10/2012 | Komori | H01L 27/1157 |
| | | | 257/324 |
| 8,338,882 B2* | 12/2012 | Tanaka | H01L 27/11575 |
| | | | 257/324 |
| 8,432,744 B2 | 4/2013 | Umezawa et al. | |
| 8,552,472 B2 | 10/2013 | Kim et al. | |
| 8,643,142 B2* | 2/2014 | Higashitani | H01L 27/11565 |
| | | | 257/533 |
| 8,796,818 B2 | 8/2014 | Roohparvar | |
| 8,841,676 B2 | 9/2014 | Piper | |
| 9,431,415 B2* | 8/2016 | Shin | H01L 27/11578 |
| 2009/0168482 A1 | 7/2009 | Park et al. | |
| 2010/0265765 A1 | 10/2010 | Seo et al. | |
| 2013/0119461 A1 | 5/2013 | Kim et al. | |
| 2014/0210058 A1 | 7/2014 | Lee et al. | |

\* cited by examiner

SEMICONDUCTOR DEVICE INCLUDING CELL REGION STACKED ON PERIPHERAL REGION AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2015-0053885, filed on Apr. 16, 2015, in the Korean Intellectual Property Office, the entire contents of which are hereby incorporated by reference.

TECHNICAL FIELD

Example embodiments of the inventive concept relate to a semiconductor device, and in particular, to a semiconductor device including a peripheral region and a cell region stacked thereon and a method of fabricating the same.

DISCUSSION OF RELATED ART

As semiconductor processing technology advances, there is increasing demand for reduced design rule and higher integration density. One approach to higher integration density may be by forming semiconductor devices vertically in addition to horizontally, in a three-dimensional structure. As an example, in a cell-on-peripheral (COP) structure, a cell region that previously occupied horizontal substrate real estate is stacked vertically on top of a peripheral region.

While the footprint size of a COP structure may be reduced as compared to a 2 dimensional structure, unintended electrical coupling may occur between conductive lines of the peripheral region and a substrate of the cell region. Such coupling may lead to deterioration in electric characteristics of a semiconductor device.

SUMMARY

Example embodiments of the inventive concept provide a semiconductor device, which is configured to prevent an electrical coupling from occurring between peripheral and cell regions stacked vertically, and a method of fabricating the same.

Other example embodiments of the inventive concept provide a semiconductor device, which is configured to prevent electrical interference (e.g., a cross talk effect) from occurring, and a method of fabricating the same.

An aspect of the inventive concept is to provide a ground pattern between a peripheral region and a cell region.

Other aspect of the inventive concept is to provide a semiconductor device, in which a portion of a substrate of a cell region is grounded to suppress or prevent other portion of the cell region from being coupled with a metal line of a peripheral region.

Still other aspect of the inventive concept is provide a semiconductor device, in which a ground metal plate is provided on a metal line of a peripheral region to suppress or prevent the metal line from being electrically coupled with a substrate of a cell region.

According to example embodiments of the inventive concept, a semiconductor device may include a peripheral region including a lower substrate and a peripheral circuit provided thereon, and a cell region including an upper substrate and a cell array provided thereon, the cell region being stacked on the peripheral region. When an operation signal is applied to the cell region from the peripheral region, at least a portion of the peripheral and cell regions may be used as a ground pattern applied with a ground signal, thereby being in an electrical ground state.

An example embodiment of the inventive concept provides a cell-on-peripheral structure including a peripheral region and a cell region stacked thereon, wherein the peripheral region comprises a lower substrate, a peripheral circuit provided on the lower substrate, and a peripheral metal line electrically connected to the peripheral circuit, wherein the cell region comprises an upper substrate and a cell region overlapping the peripheral circuit, wherein the upper substrate includes a base substrate encompassing junction regions electrically connected to circuits in the cell region; and a grounding structure disposed between the base substrate and the peripheral metal line, the grounding structure providing an electrical ground during a memory cell erase operation.

In an example embodiment, during the memory cell erase operation, a higher voltage is applied to the upper substrate than a voltage applied to the peripheral circuit.

In an example embodiment, the grounding structure is a well structure encompassing the base substrate.

In an example embodiment, the well structure includes a first well encompassing the base substrate and a second well encompassing the first well.

In an example embodiment, the base substrate is a polysilicon layer doped with a first connectivity type, and the well structure includes at least one polysilicon layer doped with a second connectivity type.

In an example embodiment, the base substrate is a polysilicon layer doped with a first connectivity type, and the first well is a polysilicon layer doped with a second connectivity type, and the second well is a polysilicon layer doped with the first connectivity type.

In an example embodiment, the grounding structure is connected to ground via a plug.

In an example embodiment, the grounding structure is a metal plate.

In an example embodiment, the metal plate overlaps the entire cell region.

In an example embodiment, the metal plate partially overlaps the cell region.

In an example embodiment, the metal plate partially overlaps the cell region and overlaps the entire peripheral circuit.

In an example embodiment, the cell region includes a 3D memory cell.

In an example embodiment, the junction regions in the base substrate and junctions regions in the well structure are connected to metal lines via plugs.

In an example embodiment, a higher voltage is applied to at least one junction region in the base substrate, and a ground voltage is applied to a junction region in the well.

In an example embodiment, a gate stack disposed on the base substrate, wherein the junction regions in the base substrate are disposed spaced apart and outside of opposing sides of the gate stack when viewed from above the gate stack toward the base substrate.

In an example embodiment, the junction regions in the base substrate are connected to a metal line via respective plugs extending vertically from the junction regions.

In an example embodiment, the metal plate is connected to a metal line in the cell region.

In an example embodiment, the metal plate is connected to a metal line in the peripheral region.

In an example embodiment, the cell region includes a vertical-type NAND memory device.

In an example embodiment, a ground signal is selectively applied to the grounding structure to provide the electrical ground.

An example embodiment provides a semiconductor device having a cell-on-peripheral structure including a peripheral region and a cell region stacked thereon, wherein the peripheral region comprises a lower substrate, a peripheral circuit provided on the lower substrate, and a peripheral metal line electrically connected to the peripheral circuit, wherein the cell region comprises an upper substrate and a cell region overlapping the peripheral circuit, wherein the upper substrate includes a base substrate encompassing junction regions electrically connected to circuits in the cell region; and a grounding structure disposed between the base substrate and the peripheral metal line, the grounding structure provides an electrical ground during a memory operation.

In an example embodiment, the memory operation is a cell erase operation, and a higher voltage is applied to the upper substrate than a voltage applied to the peripheral circuit.

In an example embodiment, the electrical ground is selectively provided during a memory operation by application of a grounding signal to the grounding structure during the memory operation.

A method is provided for operating a semiconductor device having a cell-on-peripheral structure including a peripheral region and a cell region stacked thereon, wherein the peripheral region comprises a lower substrate, a peripheral circuit provided on the lower substrate, and a peripheral metal line electrically connected to the peripheral circuit, wherein the cell region comprises an upper substrate and a cell region overlapping the peripheral circuit, wherein the upper substrate includes a base substrate encompassing junction regions electrically connected to circuits in the cell region, comprising: applying a ground to a grounding structure disposed between the base substrate and the peripheral metal line, and applying a first voltage to the base substrate and a second voltage to the peripheral circuit during a memory operation, wherein the first voltage is higher relative to the second voltage.

In an example embodiment, the ground is applied to the base substrate when a grounding signal is selectively applied to the grounding structure.

In an example embodiment, the memory operation is a cell erase operation.

According to example embodiments of the inventive concept, a method of fabricating a semiconductor device may include providing a peripheral region including a lower substrate and a peripheral circuit thereon, providing a cell region including an upper substrate and a cell array thereon, on the peripheral region, and forming a ground pattern preventing the cell region from being electrically coupled with the peripheral region. The ground pattern may be applied with a ground signal and may be in a ground state, at least during an operation of applying an operation signal to the upper substrate.

In example embodiments, the providing of the cell region may include forming a semiconductor layer of a first conductivity type on the peripheral region, doping a portion of the semiconductor layer with impurities having a second conductivity type different from the first conductivity type to form a deep well in the semiconductor layer, and doping a portion of the deep well with impurities having the first conductivity type to form a pocket well in the deep well. The pocket well may be enclosed by the deep well, thereby being disconnected from the semiconductor layer, and the semiconductor layer disconnected from the pocket well by the deep well may serve as the ground pattern.

In example embodiments, the providing of the cell region further may include doping a portion of the pocket well, which is positioned outside a side edge of the cell array, with impurities having the first conductivity type to form a first junction region having a doping concentration higher than that of the pocket well, doping a portion of the semiconductor layer, which is positioned outside the side edge of the cell array, with impurities having the first conductivity type to form a second junction region having a doping concentration higher than that of the semiconductor layer, forming a first plug coupled to the first junction region and electrically connected to the pocket well, and forming a second plug coupled to the second junction region and electrically connected to the semiconductor layer.

In example embodiments, the providing of the cell region may further include doping a portion of the deep well, which is positioned outside an side edge of the cell array, with impurities having the second conductivity type to form a third junction region having a doping concentration higher than that of the deep well, and forming a third plug coupled to the third junction region and electrically connected to the deep well.

In example embodiments, the providing of the peripheral region may include forming a ground metal plate on the peripheral circuit, and the ground metal plate may serve as the ground pattern.

In example embodiments, the forming of the cell region may include forming a connection circuit electrically connected to the cell array. Here, the ground metal plate may be electrically connected to a ground line, which is included in one of the peripheral circuit and the connection circuit, and to which a ground signal is applied.

BRIEF DESCRIPTION OF THE DRAWINGS

Example embodiments will be more clearly understood from the following brief description taken in conjunction with the accompanying drawings. The accompanying drawings represent non-limiting example embodiments as described herein.

Figure 1A:
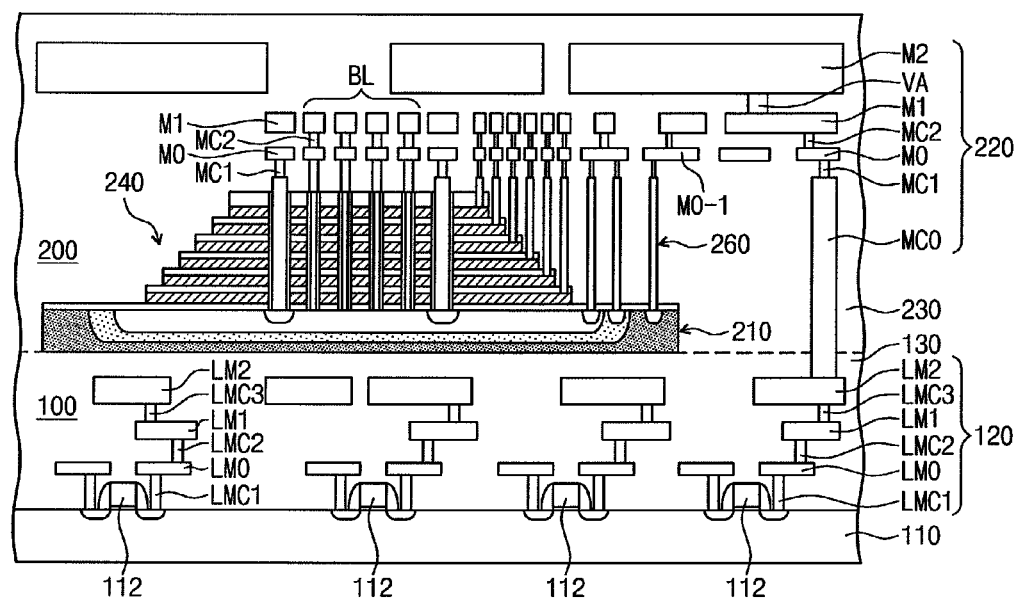
FIG. 1A is a sectional view illustrating a semiconductor device according to an example embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DESCRIPTION OF EMBODIMENTS

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to an example embodiment of the inventive concept, a semiconductor device is provided including a cell-on-peripheral (COP) structure wherein a cell region is stacked on a peripheral region, wherein the cell region comprises an upper substrate and the upper substrate in turn includes a base substrate. The upper substrate encompasses junction regions electrically connected to circuits in the cell region. The circuits in the cell region include a memory array. The memory array includes a plurality of nonvolatile memory cells. According to at least one embodiment of the inventive concept, a grounding structure is disposed between the base substrate and the peripheral region. The grounding structure may be selectively supplied with a grounding signal that, upon activation, provides an electrical ground. According to at least one embodiment, the grounding signal is supplied and activated during a memory cell erase operation.

Figure 1B:
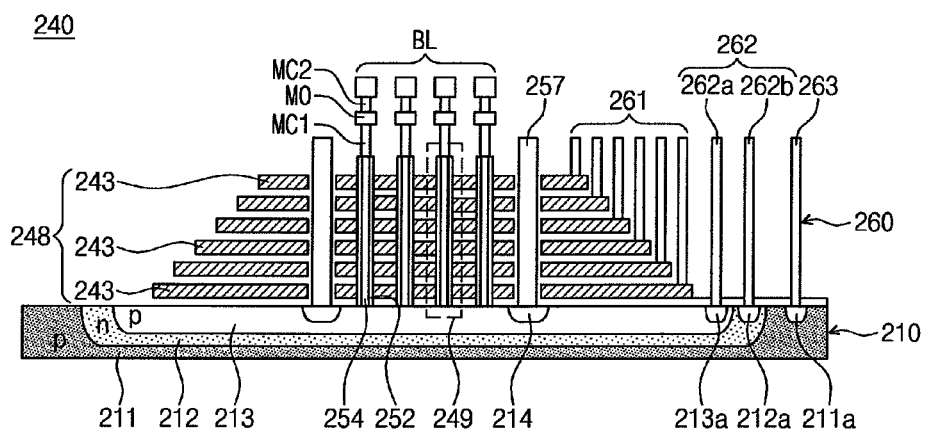
FIG. 1B is an enlarged sectional view illustrating a portion of the semiconductor device of FIG. 1A.
Figure 1C:
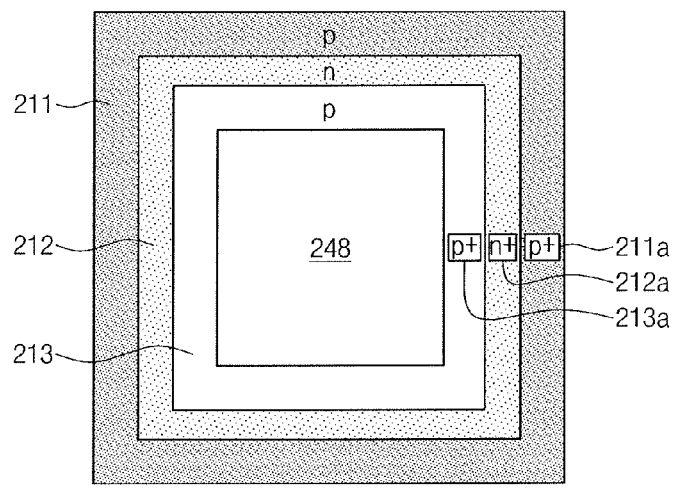
FIG. 1C is an enlarged plan view illustrating a portion of the semiconductor device of FIG. 1B.
Figure 1D:
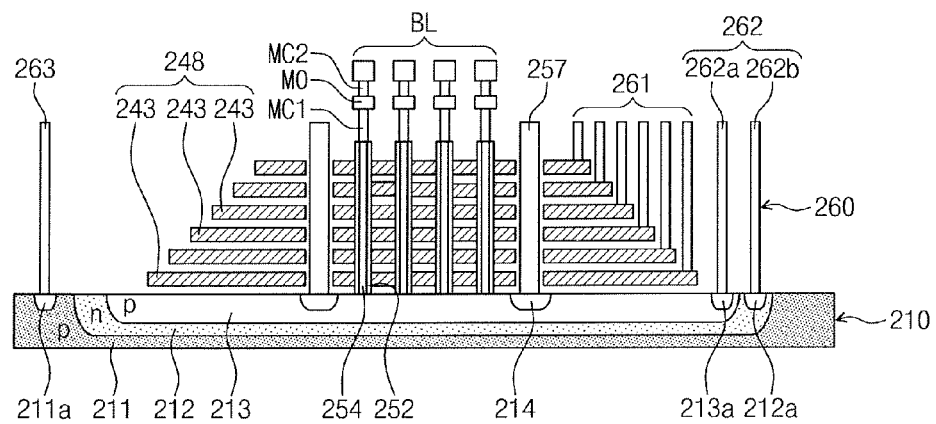
FIG. 1D is a sectional view illustrating a modification of FIG. 1B.

FIG. 1A is a sectional view illustrating a semiconductor device according to an example embodiment of the inventive concept. FIG. 1B is an enlarged sectional view illustrating a portion of the semiconductor device of FIG. 1A. FIG. 1C is an enlarged plan view illustrating a portion of FIG. 1B. FIG. 1D is a sectional view illustrating a modification of FIG. 1B.

Referring to FIG. 1A, a semiconductor device 10 may be implemented in a cell-on-peripheral (COP) structure including a peripheral region 100 and a cell region 200 stacked on the peripheral region 100. At least a portion of the peripheral region 100 may be overlapped with at least a portion of the cell region 200, when viewed in a plan view. For concise description, the description that follows will refer to an example of the present embodiment in which the entire area of the cell region 200 is vertically overlapped with the entire area of the peripheral region 100, but the inventive concept are not limited to this specific example. For example, the cell region 200 may overlap less than an entire area of the peripheral region 100.

The peripheral region 100 may include at least one peripheral transistor 112 disposed on a lower substrate 110, a peripheral circuit wiring 120 electrically connected to the peripheral transistor 112, and a lower insulating layer 130 covering at least the peripheral circuit wiring 120 and the peripheral transistor 112.

The cell region 200 may include an upper substrate 210, a cell array 240 disposed on the upper substrate 210, and an upper insulating layer 230 covering the cell array 240. The cell region 200 may further include a connection circuit wiring 220 electrically connecting the cell array 240 with the peripheral circuit wiring 120. The cell array 240 may include a metal contact 260 electrically connecting the cell array 240 with the connection circuit wiring 220.

In the peripheral region 100, the lower substrate 110 may include a semiconductor substrate (e.g., a silicon wafer). As an example, the peripheral circuit wiring 120 may include a lower metal line LM0, an intermediate metal line LM1, and an upper metal line LM2, which are vertically stacked on and from the lower substrate 110. The peripheral circuit wiring 120 may further include a lower metal contact LMC1 electrically connecting the peripheral transistor 112 with the lower metal line LM0, an intermediate metal contact LMC2 electrically connecting the lower metal line LM0 with the intermediate metal line LM1, and an upper metal contact LMC3 electrically connecting the intermediate metal line LM1 with the upper metal line LM2.

In the cell region 200, the cell array 240 may include a plurality of cells, which are vertically stacked on the upper substrate 210 with a well structure, thereby having a three-dimensional structure. The metal contact 260 may be provided to electrically connect the plurality of cells of the cell array 240 to the connection circuit wiring 220 of the upper substrate 210. This will be described in more detail with reference to FIG. 1B.

The connection circuit wiring 220 may be electrically connected to the peripheral circuit wiring 120. The connection circuit wiring 220 may include a lower metal line M0, an intermediate metal line M1, and an upper metal line M2, which are sequentially stacked on the cell array 240. The connection circuit wiring 220 may further include a connection metal contact MC0 electrically connecting the peripheral circuit wiring 120 with the connection circuit wiring 220, a lower metal contact MC1 electrically connecting the connection metal contact MC0 with the lower metal line M0, an intermediate metal contact MC2 electrically connecting the lower metal line M0 with the intermediate metal line M1, an upper metal contact (hereinafter, referred to as a via VA) electrically connecting the intermediate metal line M1 with the upper metal line M2. The lower metal contact MC1 may connect the cell array 240 to the lower metal line M0. The intermediate metal line M1 may include a bit line BL electrically connected to a vertical channel (e.g., 254 of FIG. 1B) of the cell array 240.

Referring to FIG. 1B, the upper substrate 210 may be formed of, for example, a poly-silicon layer. The upper substrate 210 may include a well structure, which may be formed by doping the poly-silicon layer and may include wells having a first conductivity type (e.g., p-type) and a second conductivity type (e.g., n-type). As an example, the upper substrate 210 may include a pocket well 213, which is doped to have the first conductivity type (e.g., p-type), a deep well 212, which is formed to enclose the pocket well 213 and is doped to have the second conductivity type (e.g., n-type), and a base substrate 211 enclosing the deep well 212 and having the first conductivity type (e.g., p-type). The deep well 212 may be provided to separate the pocket well 213 electrically and spatially from the base substrate 211.

The cell array 240 may include a gate stack 248 provided on the pocket well 213 of the upper substrate 210. The gate stack 248 may include gates 243 vertically stacked on the upper substrate 210. The cell array 240 may further include a vertical channel 254, which is vertically formed to penetrate the gate stack 248 and is electrically connected to the upper substrate 210, a memory layer 252 extending along the vertical channel 254, a common source 214, which is formed in the pocket well 213 of the upper substrate 210 to serve as a common source line CSL, and a common source plug 257 electrically connected to the common source 214.

The common source plug 257 may be electrically separated from the gates 243. A top portion of the vertical channel 254 may serve as a drain electrode. The memory layer 252 may have a shape enclosing the vertical channel 254. As another example, the memory layer 252 may have a shape enclosing the gates 243 (not shown).

The vertical channel 254 may be electrically connected to the bit line BL via the lower metal line M0. The common source plug 257 may be electrically connected to the lower metal line M0 via the lower metal contact MC1, as shown in FIG. 1A.

The lowermost one of the gates 243 may be used as a part of a ground selection line GSL, the uppermost one of the gates 243 may be used as a part of a string selection line SSL, and the others of the gates 243 may be used as word lines WL. According to at least one embodiment, the cell array 240 includes a vertical-type NAND (VNAND) FLASH memory device. The gates 243 may be stacked in stepwise manner and may have pads, to which the metal contacts 260 are connected. The gates 243, which are vertically stacked along the vertical channels 254, may constitute a memory cell string 249.

The metal contact 260 may include a plurality of first metal plugs 261, which are respectively connected to the pads of the gates 243, and at least one second metal plug 262 and at least one third metal plug 263, which are connected to the upper substrate 210.

Each of the first metal plugs 261 may be electrically connected to the lower metal line M0 via the lower metal contact MC1, as shown in FIG. 1A. Accordingly, the cell region 200 including gates 243 may be configured to communicate data with the peripheral region 100.

The second metal plug 262 may include a main metal plug 262a electrically connected to the pocket well 213 and a sub metal plug 262b electrically connected to the deep well 212, thereby having a dual plug structure.

A main junction region 213a may be provided in the pocket well 213 and may be coupled to the main metal plug 262a. The main junction region 213a may be doped to have the same conductivity type (e.g., the first conductivity type or p-type) as the pocket well 213. The main junction region 213a may be formed to have a doping concentration higher than that of the pocket well 213.

A sub junction region 212a may be provided in the deep well 212 and may be coupled to the sub metal plug 262b. The sub junction region 212a may be doped to have the same conductivity type (e.g., the second conductivity type or n-type) as the deep well 212. The sub junction region 212a may be formed to have a doping concentration higher than that of the deep well 212.

The third metal plug 263 may be electrically connected to the base substrate 211. A substrate junction region 211a may be provided in the base substrate 211 and may be coupled to the third metal plug 263. The substrate junction region 211a may be doped to have the same conductivity type (e.g., the first conductivity type or p-type) as the base substrate 211. The substrate junction region 211a may be formed to have a doping concentration higher than that of the base substrate 211.

Referring to FIG. 1C, which is a schematic plan view of the cell array 240, viewing from above the cell array 240 toward the upper substrate 210, the main junction region 213a, the sub junction region 212a, and the substrate junction region 211a may be provided outside of one side of the gate stack 248. Thus, according to this embodiment, the electrical connection of the junction regions via the second metal plug 262 and the third metal plug 263 may be provided spaced apart from and on one side of the gate stack 248 (See FIG. 1B).

Another embodiment of the inventive concept is shown in FIG. 1D. Referring to FIG. 1D, the main junction region 213a and the sub junction region 212a may be provided outside of a right side of the gate stack 248, and the substrate junction region 211a may be provided outside of a left side of the gate stack 248. Correspondingly, the second metal plug 262 is provided adjacent to but spaced apart from the right-most portion of the gate stack 248, and the third metal plug 263 may be provided adjacent to but spaced apart from the left-most portion of the gate stack 248.

Referring back to FIG. 1A and FIG. 1B, the main metal plug 262a and the sub metal plug 262b, via the lower metal contact MC1, may be electrically connected in common to the lower metal line M0. Thus, an electrical signal may be applied in common to the pocket well 213 and the deep well 212 via lower metal line M0, which may be transmitted from the peripheral region 100.

The third metal plug 263 is connected to line M0-1 via the lower metal contact MC1. M0-1 may be one of the lower metal line M0. The base substrate 211 may be selectively placed in a ground state by applying a ground signal through the third metal plug 263 from ground line M0-1.

According to an example embodiment, the base substrate 211 may be selectively placed in a ground state during an operation of the cell array 240 by selectively applying a ground signal at line m0-1. According to another example embodiment, the base substrate 211 may be permanently in the ground state, regardless of the operation of the cell array 240, by connecting line m0-1 to a ground layer or plane. By placing the base substrate 211 in ground state, either selectively at least during the operation of the cell array 240, or permanently, there exists a grounded region between the cell region 200 and the peripheral region 100.

Referring back to FIGS. 1A and 1B, a voltage may be applied to the upper substrate 210 to operate the cell array 240. For example, to perform an erase operation in the unit of a block, an erase voltage may be applied to the pocket well 213 and the deep well 212 of the upper substrate 210 through the main metal plug 262a and the sub metal plug 262b, and a voltage of 0V or the like may be applied to the gates 243.

During the erase operation, the third metal plug 263 may be used to apply the ground voltage to the base substrate 211, and thus, the base substrate 211 may be in the ground state. Since the base substrate 211 is in the ground state, the upper metal line LM2 of the peripheral region 100 adjacent to the upper substrate 210 may be prevented from being affected by a relatively high voltage, at about 12V to about 20V (e.g., the erase voltage), applied to the upper substrate 210. In such instance, electrical interference (e.g., cross talk) between the upper metal line LM2 and the upper substrate 210 may be minimize or prevented.

In FIGS. 1A through 1D, each of elements, which are not denoted by any reference numeral, may be an insulating layer, unless otherwise specified. The same is true of other example embodiments to be described below.

Figure 1E:
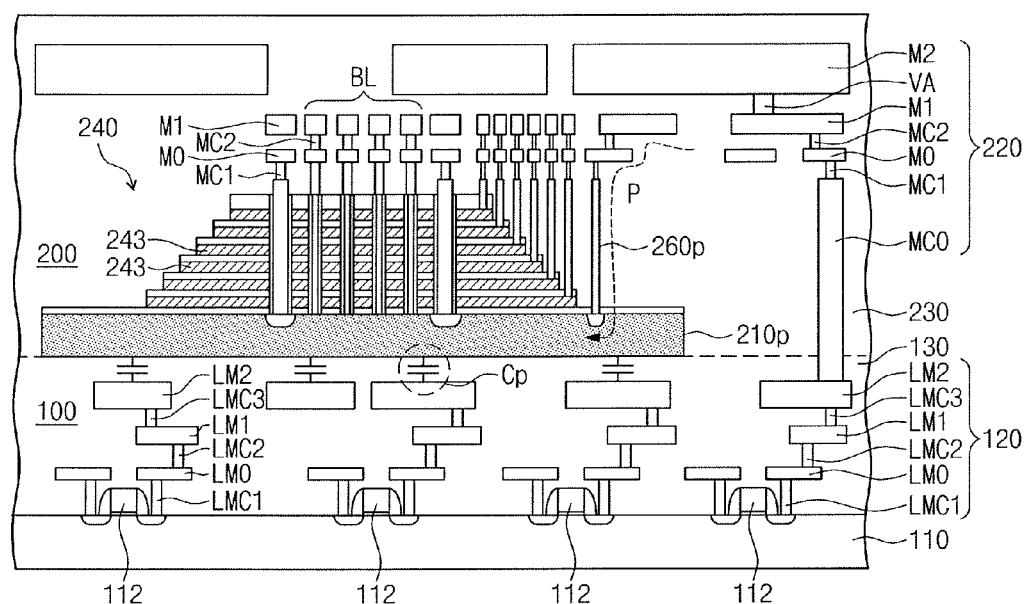
FIG. 1E is a sectional view of a semiconductor device including schematic representations.

FIG. 1E is a sectional view illustrating a semiconductor device 10p. Unlike the semiconductor device 10, the semiconductor device 10p may include an upper substrate 210p wherein a well structure is not formed. In this comparative example, a metal contact 260p may include a plurality of metal plugs coupled to the gates 243 and the upper substrate 210p of the cell array 240. A relatively high voltage may be applied to the upper substrate 210p through an electric path P to, for example, erase the cell array 240, such voltage applied to the upper substrate 210p may lead the upper metal line LM2 of the peripheral region 100, which is positioned adjacent to the upper substrate 210p, to suffer from an unintended electrical interference (e.g., a cross-talk effect). Parasitic capacitance Cp may be produced between the upper substrate 210p and the upper metal line LM2, and such unintended coupling may lead to deterioration in electric characteristics of the semiconductor device 10p.

Figure 2A:
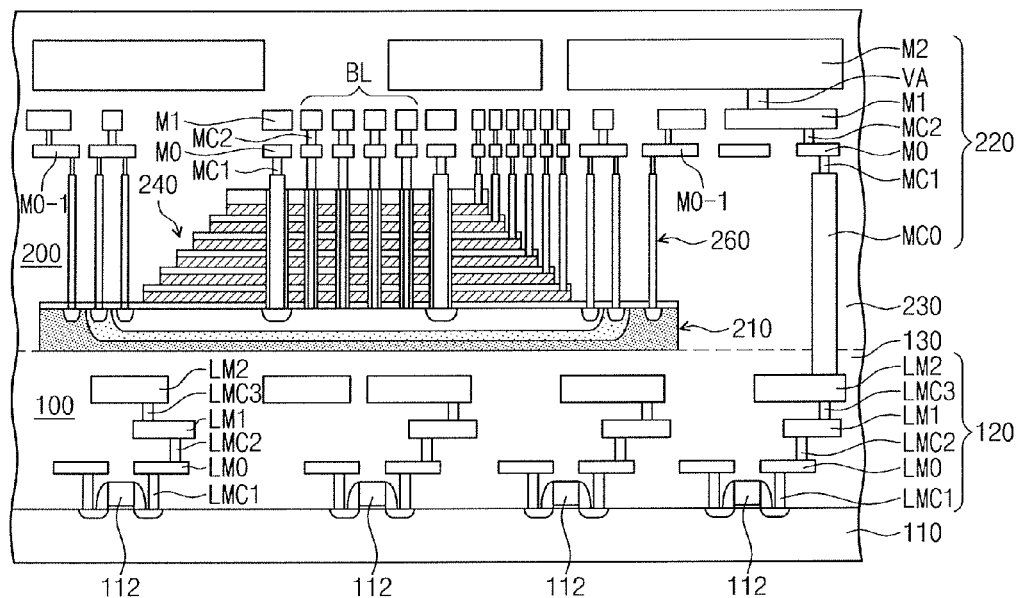
FIG. 2A is a sectional view illustrating a semiconductor device according to other example embodiments of the inventive concept.
Figure 2B:
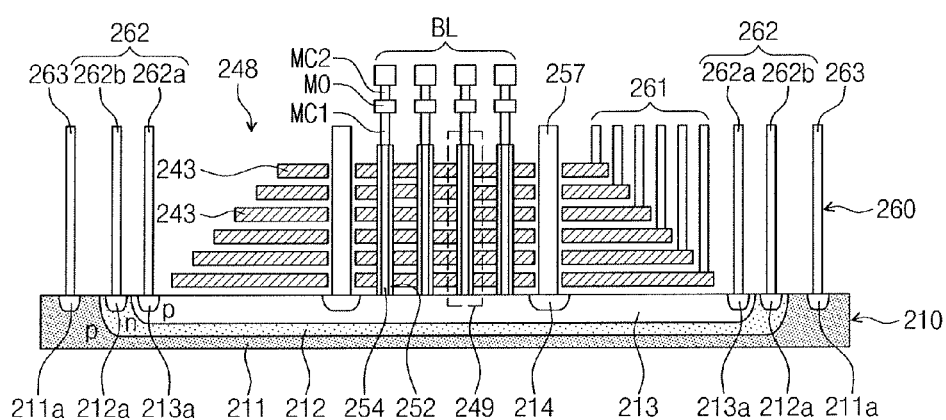
FIG. 2B is an enlarged sectional view illustrating a portion of FIG. 2A.
Figure 2C:
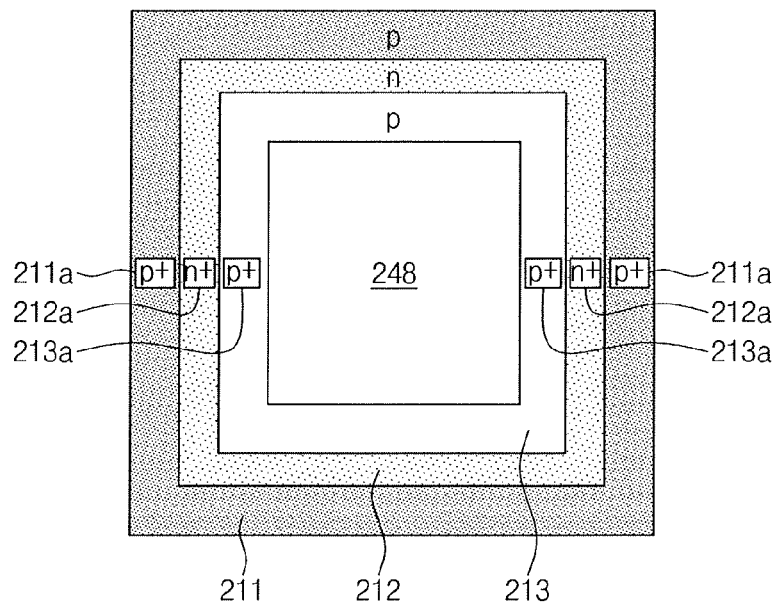
FIG. 2C is an enlarged plan view illustrating a portion of FIG. 2B.
Figure 2D:
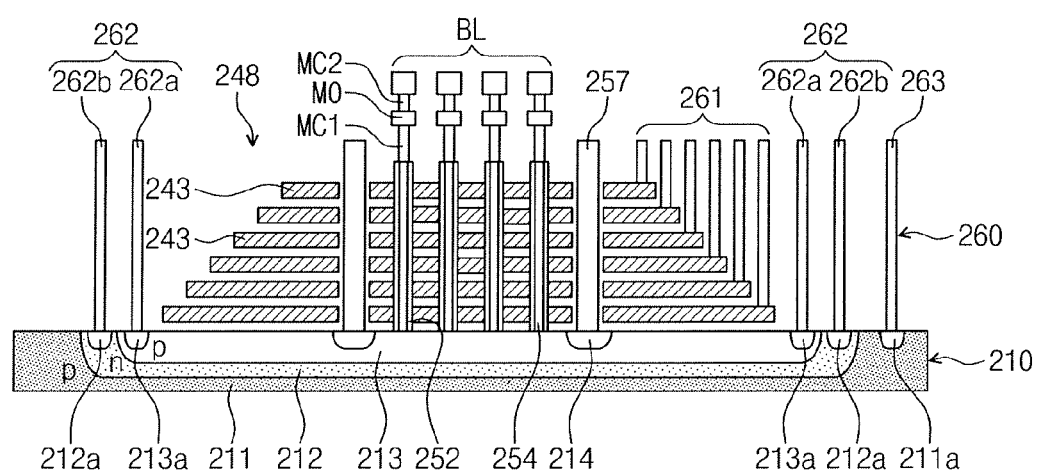
FIG. 2D is a sectional view illustrating a modification of FIG. 2B.

FIG. 2A is a sectional view illustrating a semiconductor device according to an example embodiment of the inventive concept. FIG. 2B is an enlarged sectional view illustrating a portion of FIG. 2A. FIG. 2C is a plan view illustrating a portion of FIG. 2B. FIG. 2D is a sectional view illustrating a modification of FIG. 2B.

Referring to FIG. 2A, a semiconductor device 20 having a COP structure is provided, in which the cell region 200 with a nonvolatile memory cell array 240 is stacked on the peripheral region 100. For purposes of illustrating embodiments of the inventive concept, a VNAND-type cell array is described herein; however, one ordinary skilled in the art can readily appreciate that the embodiments of the inventive concept are applicable to other memory types and not limited to the VNAND-type memory. Hereinafter, unless otherwise specified, the above description for the semiconductor device 10 may be applied to the semiconductor device 20 of FIG. 2A and to the other embodiments described hereinbelow.

Referring to FIG. 2B, the semiconductor device 20 may include two sets of second metal plugs 262, with each set provided on opposite sides, spaced apart from the right- and left-hand regions, respectively, of the gate stack 248. Similarly, the semiconductor device 20 may include a pair of third metal plugs 263, with each third metal plug 263 disposed adjacent to respective pair of second metal plugs 262 on opposite sides of the gate stack 248. By applying a common signal, the plurality of second metal plugs 262 may behave like a single plug in terms of electrical characteristics as well as the third metal plugs 263.

Referring to FIGS. 2B and 2C, each of the pair of second metal plugs 262 may have a dual plug structure including the main metal plug 262a and the sub metal plug 262b. A pair of main junction regions 213a may be provided in portions of the pocket well 213, which are positioned outside the right- and left-hand regions of the gate stack 248, and a pair of the main metal plugs 262a may be connected to the pair of main junction regions 213a, respectively. Similarly, a pair of sub junction regions 212a may be provided in portion of the deep well 212, which are positioned outside the right- and left-hand regions of the gate stack 248, and a pair of the sub metal plugs 262b may be connected to the pair of sub junction regions 212a, respectively.

The third metal plugs 263 may be provided outside the right- and left-hand regions, respectively, of the gate stack 248. A pair of substrate junction regions 211a may be provided in portions of the base substrate 211, which are positioned outside the right- and left-hand regions of the gate stack 248, and the pair of third metal plugs 263 may be connected to the pair of substrate junction regions 211a, respectively.

In the present embodiment, since the pair of second metal plugs 262 and the pair of third metal plugs 263 are provided on opposing sides of the gate stack 248, the distance between the second metal plug 262 and the memory cells of the gate stack 248 and/or between the third metal plug 263 and the memory cells in the gate stack 248 may be reduced. The reduction in such distance may reduce signal transmission delay and in overall device size.

FIG. 2C shows in a plan view looking from above the gate stack 248 toward the upper substrate 210. The main junction regions 213a, sub junction regions 212a, and substrate junction regions 211a are shown disposed on opposing sides of the gate stack 248.

As another example, one of the pair of third metal plugs 263 may be omitted, as shown in FIG. 2D. For example, the third metal plug 263 may be provided outside the right-hand region of the gate stack 248, but not outside the left-hand region.

Figure 3A:
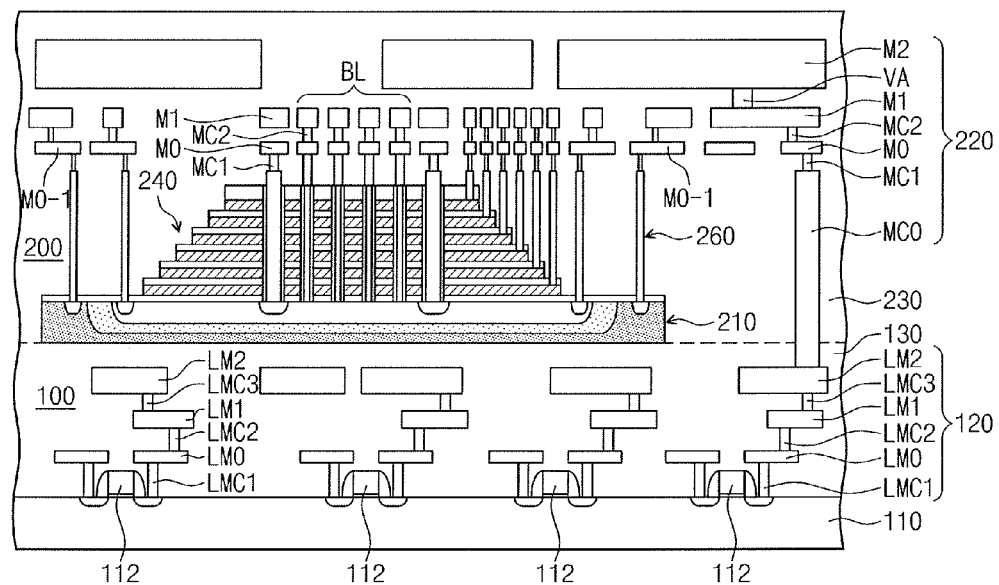
FIG. 3A is a sectional view illustrating a semiconductor device according to an example embodiment of the inventive concept.
Figure 3B:
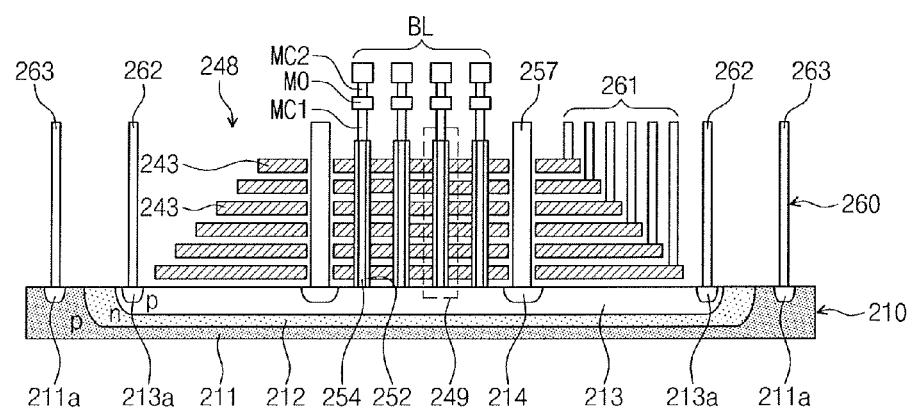
FIG. 3B is an enlarged sectional view illustrating a portion of FIG. 3A.
Figure 3C:
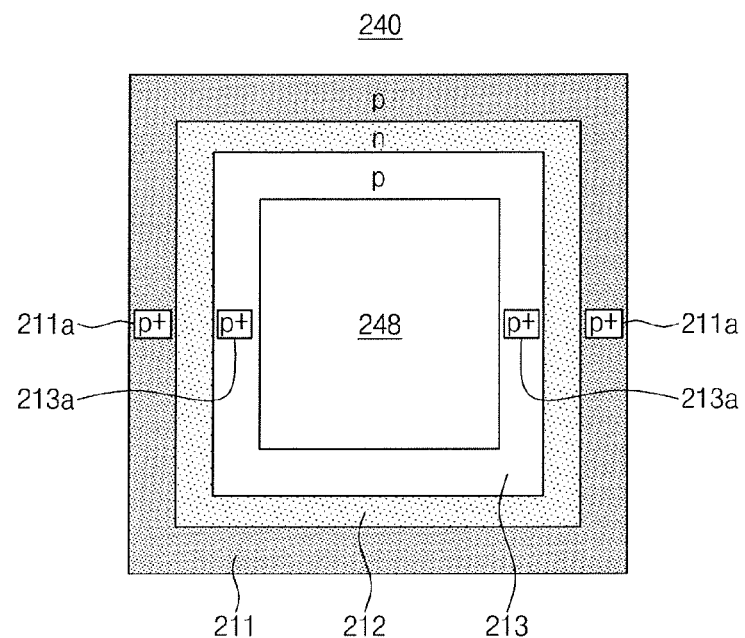
FIG. 3C is an enlarged plan view illustrating a portion of FIG. 3B.
Figure 3D:
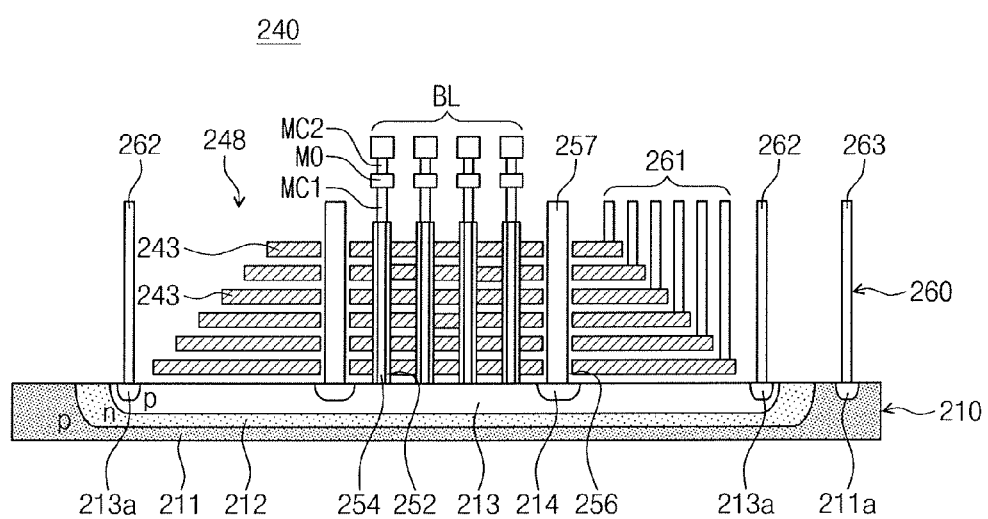
FIG. 3D is a sectional view illustrating a modification of FIG. 3B.

FIG. 3A is a sectional view illustrating a semiconductor device according to another example embodiment of the inventive concept. FIG. 3B is an enlarged sectional view illustrating a portion of FIG. 3A. FIG. 3C is a plan view illustrating a portion of FIG. 3B. FIG. 3D is a sectional view illustrating a modification of FIG. 3B.

Referring to FIGS. 3A and 3B, a semiconductor device 30 may include a pair of second metal plugs 262, one on each side of the gate stack 248, and a pair of third metal plugs 263, one on each side of the gate stack 248. Similarly, the semiconductor device 30 may include the second metal plugs 262 provided outside the right- and left-hand regions, respectively, of the gate stack 248. The pair of second metal plugs 262 may behave like a single plug in terms of electrical characteristics. Similarly, the semiconductor device 30 may include the third metal plugs 263 provided outside the right- and left-hand regions, respectively, of the gate stack 248. The pair of third metal plugs 263 may behave like a single plug in terms of electrical characteristics.

Referring to FIGS. 3B and 3C, each of the pair of second metal plugs 262 may have a single plug structure. For example, the second metal plug 262 may be a single metal plug corresponding to the main metal plug 262a of FIG. 1B. A pair of the main junction regions 213a may be provided in portions of the pocket well 213, which are positioned outside the right- and left-hand regions of the gate stack 248, and a pair of the main second metal plugs 262 may be connected to the pair of main junction regions 213a, respectively. A pair of the substrate junction regions 211a may be provided in portions of the base substrate 211, which are positioned outside the right- and left-hand regions of the gate stack 248, and the pair of third metal plugs 263 may be connected to the pair of substrate junction regions 211a, respectively.

In the present embodiment, there is no metal plug provided on the deep well 212, nor a sub junction region (212a of FIG. 1B). Accordingly, the deep well 212 may be in an electrically floating state.

In the present embodiment, a voltage may be applied to the upper substrate 210 to operate the cell array 240. For example, to perform an erase operation in a cell block, an erase voltage may be applied to the pocket well 213 of the upper substrate 210 through the pair of second metal plugs 262, and a voltage of 0V or the like may be applied to the gates 243. During an erase operation, a ground voltage may be applied to the base substrate 211 through the pair of third metal plugs 263. Accordingly, the base substrate 211 may be in the ground state. The deep well 212 may be in the electrically floating state.

As another example, one of the pair of third metal plugs 263 may be omitted, as shown in FIG. 3D. For example, the third metal plug 263 may be provided outside the right-hand region of the gate stack 248, but not outside the left-hand region.

Figure 4A:
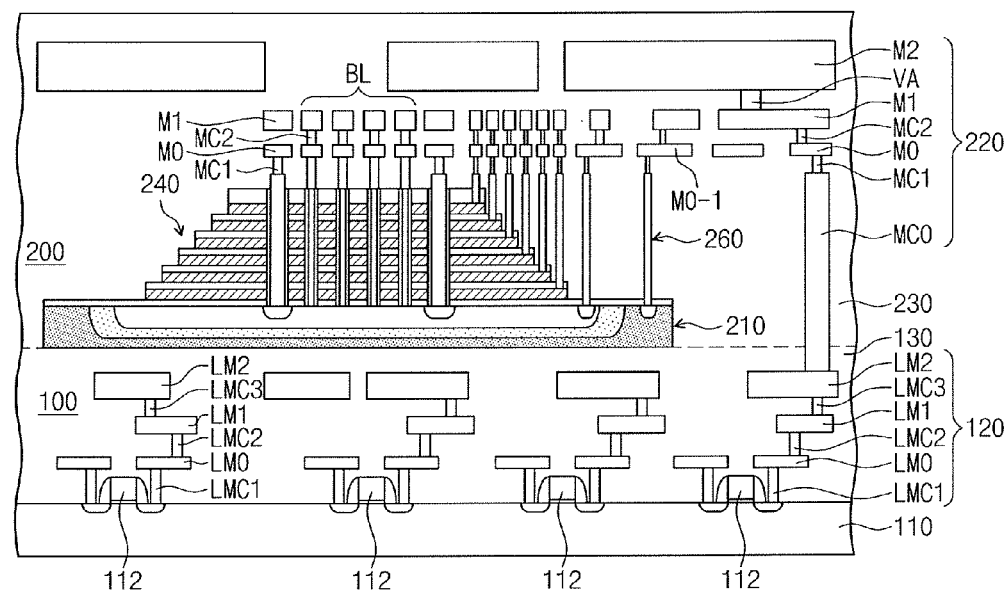
FIG. 4A is a sectional view illustrating a semiconductor device according to a further embodiment of the inventive concept.
Figure 4B:
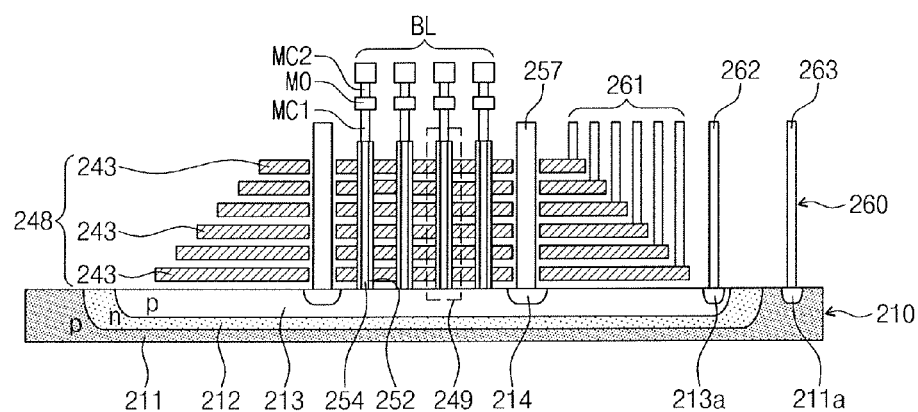
FIG. 4B is an enlarged sectional view illustrating a portion of FIG. 4A.
Figure 4C:
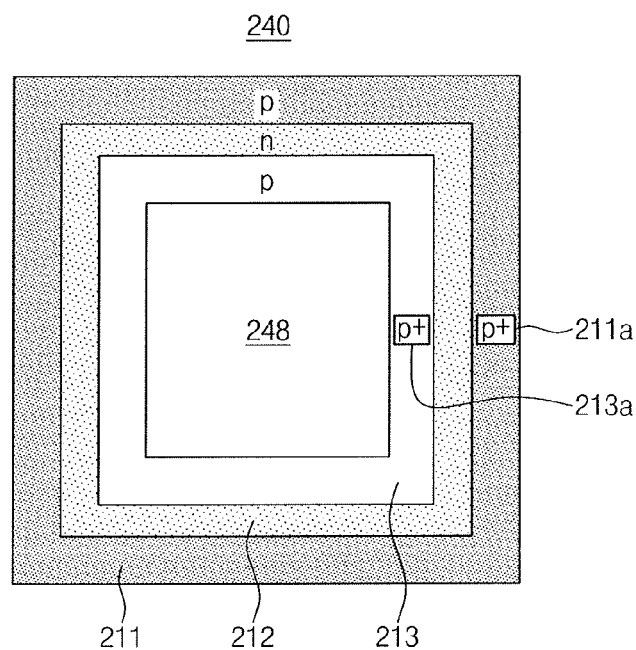
FIG. 4C is an enlarged plan view illustrating a portion of FIG. 4B.
Figure 4D:
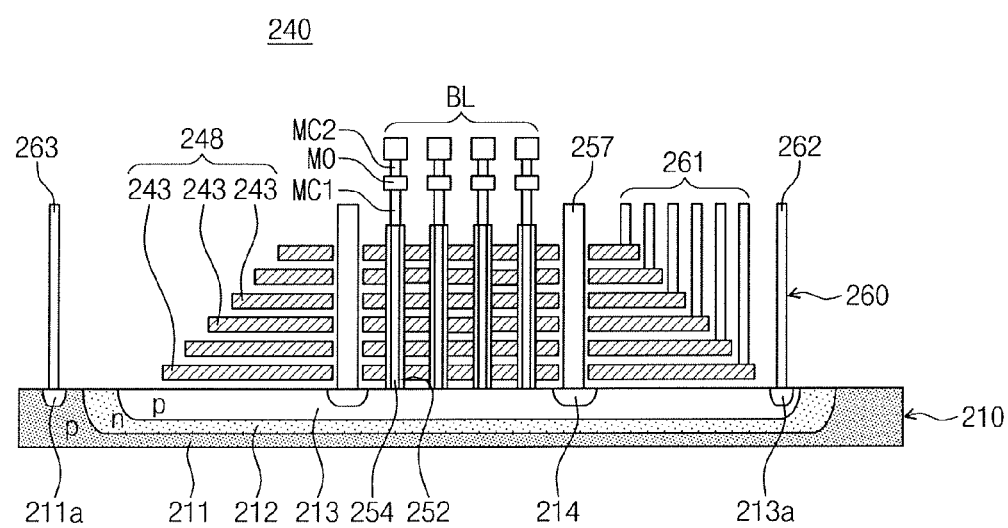
FIG. 4D is a sectional view illustrating a modification of FIG. 4B.

FIG. 4A is a sectional view illustrating a semiconductor device according to still another example embodiment of the inventive concept. FIG. 4B is an enlarged sectional view illustrating a portion of FIG. 4A. FIG. 4C is a plan view illustrating a portion of FIG. 4B. FIG. 4D is a sectional view illustrating a modification of FIG. 4B.

Referring to FIGS. 4A through 4C, a semiconductor device 40 may include the second metal plug 262 provided in a single plug structure. As an example, the semiconductor device 40 may include the second metal plug 262, which is electrically connected to a portion of the upper substrate 210 positioned outside the right-hand region of the gate stack 248, similar to the main metal plug 262a of FIG. 1B. No metal plug is provided on the deep well 212, and thus, the deep well 212 may be in an electrically floating state.

In the present embodiment, a voltage may be applied to the upper substrate 210 to operate the cell array 240. For example, to perform an erase operation in the unit of a block, an erase voltage may be applied to the pocket well 213 of the upper substrate 210 through the second metal plug 262, and a voltage of 0V or the like may be applied to the gates 243. During the erase operation, a ground voltage may be applied to the base substrate 211 through the third metal plug 263. Accordingly, the base substrate 211 may be in a ground state. The deep well 212 may be in an electrically floating state.

The third metal plug 263 may be provided outside the right-hand region of the gate stack 248, and thus it may be positioned adjacent to the second metal plug 262. As another example, as shown in FIG. 4D, the third metal plug 263 may be provided outside the left-hand region of the gate stack 248.

Figure 5A:
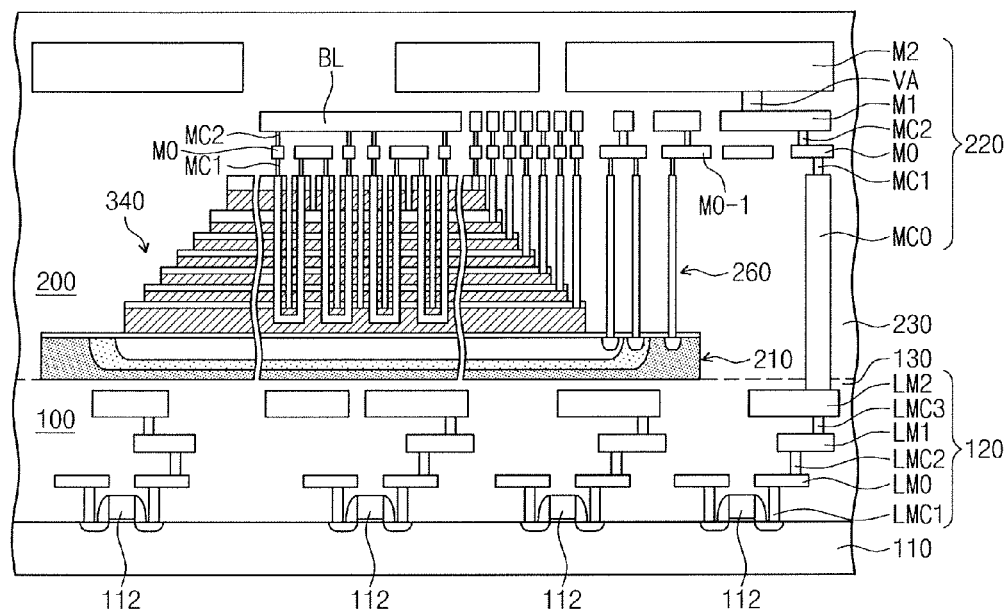
FIG. 5A is a sectional view illustrating a semiconductor device according to yet another example embodiment of the inventive concept.
Figure 5B:
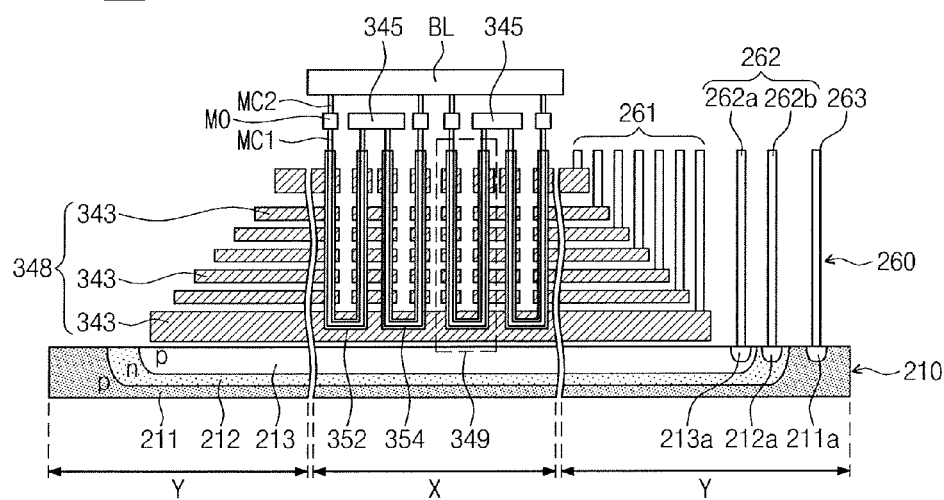
FIG. 5B is an enlarged sectional view illustrating a portion of FIG. 5A.
Figure 5C:
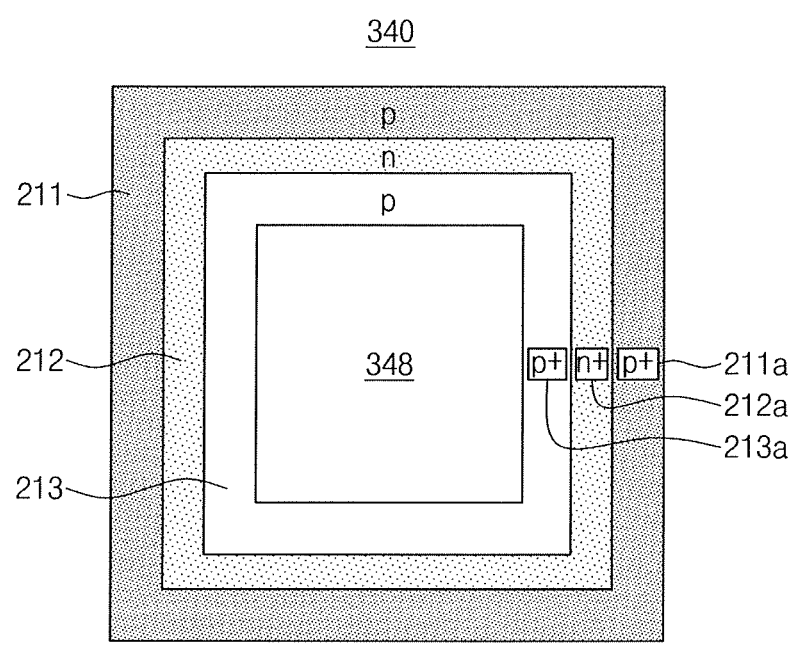
FIG. 5C is an enlarged plan view illustrating a portion of FIG. 5B.

FIG. 5A is a sectional view illustrating a semiconductor device according to another example embodiment of the inventive concept. FIG. 5B is an enlarged sectional view illustrating a portion of FIG. 5A. FIG. 5C is a plan view illustrating a portion of FIG. 5B.

Referring to FIG. 5A, similar to the semiconductor device 10 of FIG. 1A, a semiconductor device 50 having a COP structure is provided, in which the cell region 200 with a cell array 340 is stacked on the peripheral region 100. Referring to FIG. 5B, the cell array 340 may include a gate stack 348, which is vertically stacked on the upper substrate 210 provide with a well structure. In FIG. 5B, a region X corresponds to a vertical section of the semiconductor device 50, and a region Y corresponds to a vertical section of the semiconductor device 50, extending vertically orthogonal to the direction of the bit line BL.

The gate stack 348 may include gates 343 vertically stacked above the pocket well 213 of the upper substrate 210. The cell array 340 may further include "U"- or pipe-shaped channels 354 penetrating the gate stack 348, a memory layer 352 extending along each of the "U"-shaped channels 354, and a gate 345 electrically connected to an end of the "U"-shaped channels 354 to constitute a source line. The end of the "U"-shaped channels 354 electrically connected to the gate 345 may serve as a source of a cell string, and other end of the "U"-shaped channels 354 connected to the bit line BL may serve as a drain of the cell string.

The lowermost one of the gates 343 may serve as a back-gate electrode, the uppermost one of the gates 343 may serve as the string selection line SSL, and the remaining ones of the gates 343 may serve as the word lines WL. The gates 343, which are disposed along each of the "U"-shaped channels 354 or along a "U"-shaped path, may constitute a memory cell string 349.

Referring to FIGS. 5B and 5C, similar to the cell array 240 of FIG. 1B, the cell array 340 may include the second metal plugs 262, including the main metal plug 262a and the sub metal plug 262b, and the third metal plug 263 electrically connected to the base substrate 211 of the upper substrate 210. The main metal plug 262a and the sub metal plug 262b may be provided outside the right-hand region of the gate stack 348 and electrically connected to the pocket well 213 and the deep well 212, respectively, of the upper substrate 210. The second metal plug 262 may be used to apply a voltage required to operate the cell array 340 to the pocket well 213 and the deep well 212, and the third metal plug 263 may be used to apply a ground voltage to the base substrate 211.

The main junction region 213a may be provided in the pocket well 213 and may be connected to the main metal plug 262a, the sub junction region 212a may be provided in the deep well 212 and may be connected to the sub metal plug 262b, and the substrate junction region 211a may be provided in the base substrate 211 and may be connected to the third metal plug 263.

As another example, the upper substrate 210 may be formed of an insulating layer, and in such instance, the plugs 262 and 263 may not be provided thereon. In another example, the upper substrate 210 may be a single layer, which is made of at least one of n-type, p-type, or intrinsic semiconductor material, and one of the plugs 262 and 263 may be provided correspondingly thereon or may not be provided at all.

Figure 6A:
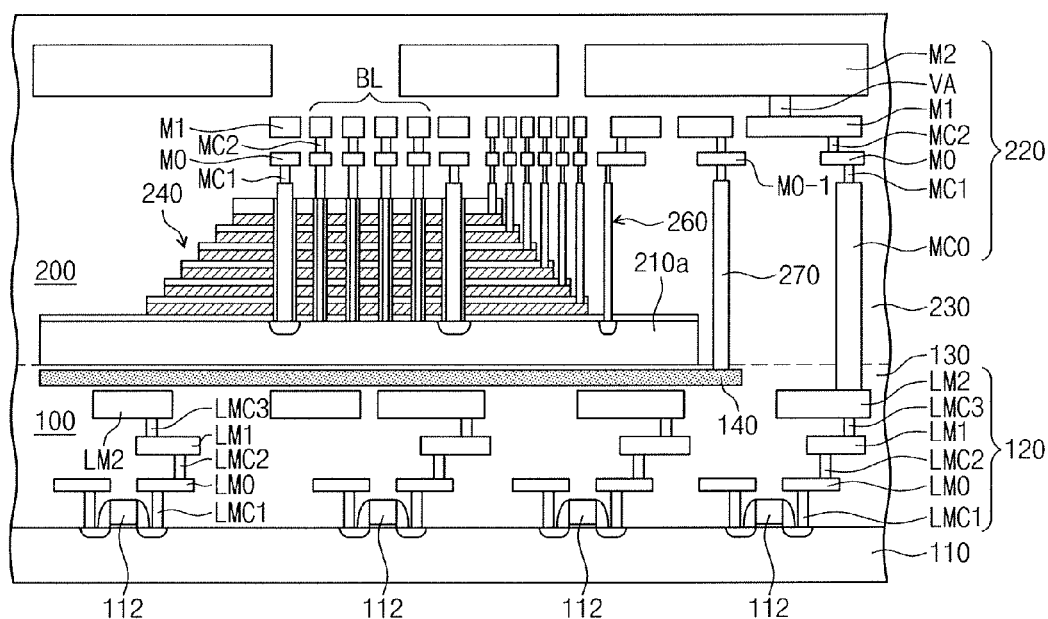
FIG. 6A is a sectional view illustrating a semiconductor device according to another further example embodiment of the inventive concept.
Figure 6B:
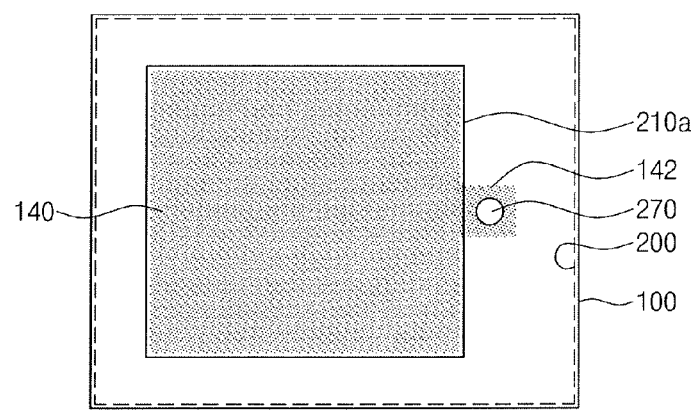
FIG. 6B is a plan view of FIG. 6A.

FIG. 6A is a sectional view illustrating a semiconductor device according to a further example embodiment of the inventive concept. FIG. 6B is a plan view of a portion of FIG. 6A. FIGS. 6C through 6F are plan views illustrating modifications of the semiconductor device of FIG. 6A including variations in the shapes and dimensions of the metal plate 140 and/or the protrusion 142.

Referring to FIG. 6A, a semiconductor device 60 may comprise an upper substrate 210a whose the entire region is doped to have the same conductivity type. For example, the upper substrate 210a may include a single doped polysilicon layer with a first conductivity type (e.g., p-type).

The peripheral region 100 may further include a ground metal plate 140. The ground metal plate 140 may be provided between the upper metal line LM2 of the peripheral region 100 and the upper substrate 210 of the cell region 200. The ground metal plate 140 may be connected to a metal line, which is one of the peripheral circuit wiring 120 or the connection circuit wiring 220, and to which a ground signal may be applied. As an example, a top surface of the ground metal plate 140 facing the upper substrate 210a may be electrically connected to the line M0-1, which may be provided with a ground signal. The ground signal may be transmitted from a circuit such as the connection circuit wiring 220. The semiconductor device 60 may further include a ground plug 270 electrically connecting the ground metal plate 140 to the ground line M0-1.

The ground metal plate 140 may be in the ground state, during the operation of the cell array 240. For example, in the case where an erase voltage is applied to the upper substrate 210a, the ground metal plate 140 may be in the ground state. As another example, the ground metal plate 140 may be connected to ground, regardless of the operation of the cell array 240. The provision of the ground metal plate 240 in the ground state minimizes or prevents electrical coupling between the upper substrate 210a and the upper metal line LM2.

At least a portion of the cell region 200 may be vertically overlapped with at least a portion of the peripheral region 100. A size or area of the ground metal plate 140 may be large enough to cover at least a portion of an overlapping region between the cell array 240 and the peripheral region 100.

As an example, as shown in FIG. 6B, the cell region 200 may be mostly or wholly overlapped with the peripheral region 100, when viewed in a plan view from above the cell region 200 toward the upper substrate 210a. In this case, the ground metal plate 140 may be overlapped with at least the entire area of the upper substrate 210a. Further, the ground metal plate 140 may have the same or similar shape as the upper substrate 210a. The ground metal plate 140 may include a protrusion 142, which is extended beyond a boundary of the upper substrate 210a, when viewed in a plan view, and is coupled to a ground plug 270.

Figure 6C:
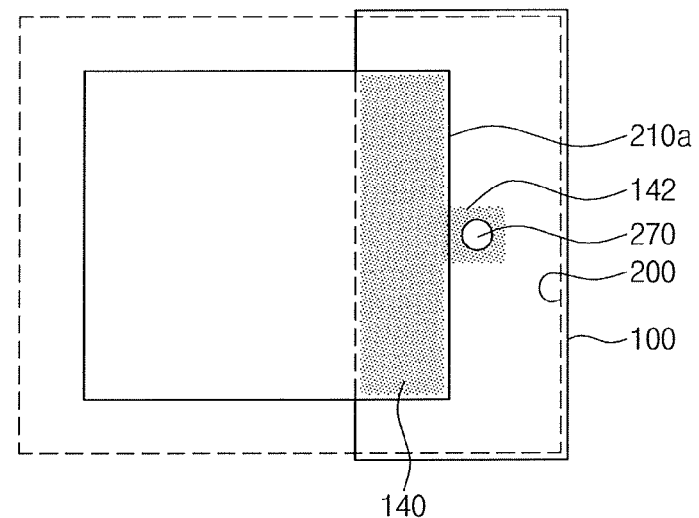
FIGS. 6C through 6F are plan views illustrating modifications of FIG. 6B.

As another example, as shown in FIG. 6C, the peripheral region 100 may be overlapped with a portion of the cell region 200. For example, the peripheral region 100 may be partially overlapped with one of edges of the cell region 200. The ground metal plate 140 may have a shape or size capable of covering a portion of the upper substrate 210a, which is overlapped with the peripheral region 100.

Figure 6D:
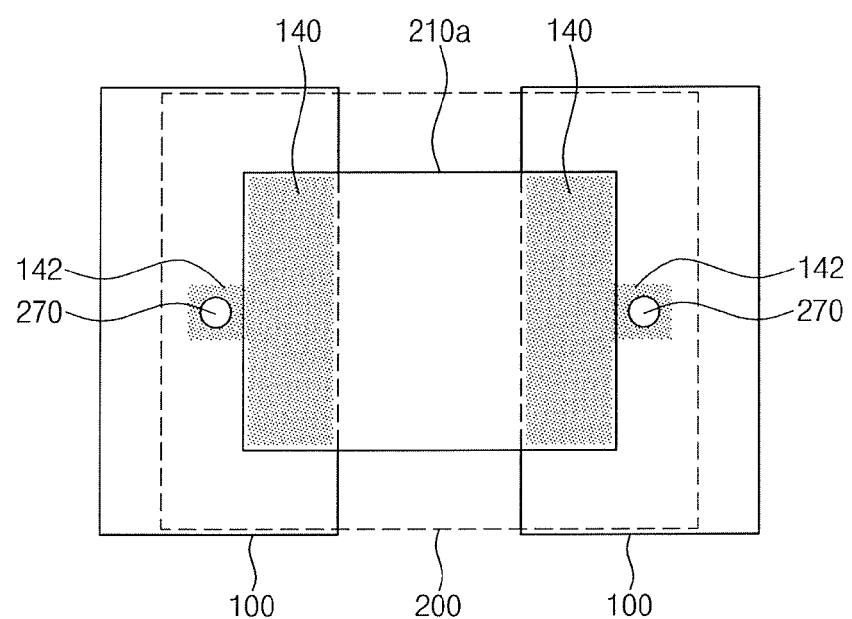

As other example, as shown in FIG. 6D, the peripheral regions 100 may be overlapped with two opposite edges of the cell region 200. In this case, at least two ground metal plates 140 may be provided to overlap the two opposite edges of the substrate 210a, which are vertically overlapped with the peripheral regions 100. The ground metal plates 140 may be electrically connected in common to the ground line M0-1 of FIG. 6A.

Figure 6E:
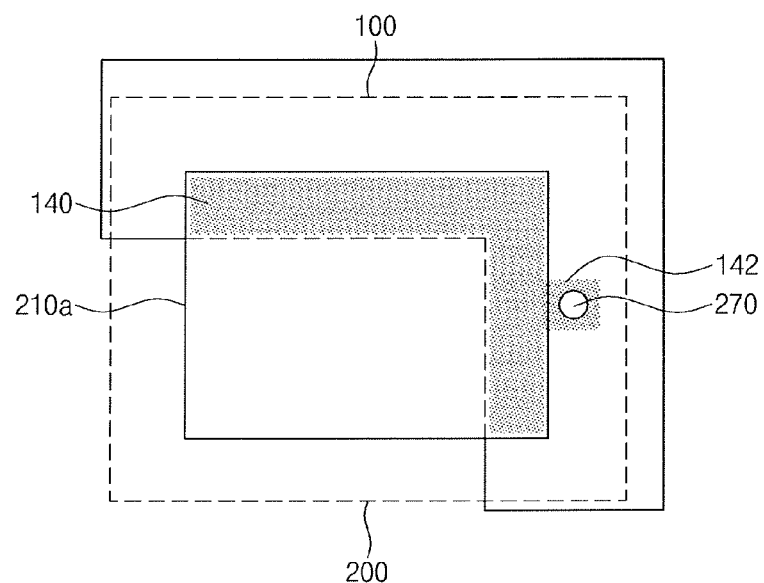

As still another example, when viewed in a plan view as shown in FIG. 6E, the peripheral region 100 may be a rotated "L"-shaped structure and may be overlapped with two adjacent edges of the cell region 200. The ground metal plate 140 may also be a rotated "L"-shaped structure, covering a portion that substantially coincides the portion of the upper substrate 210a vertically overlapped with the peripheral region 100.

Figure 6F:
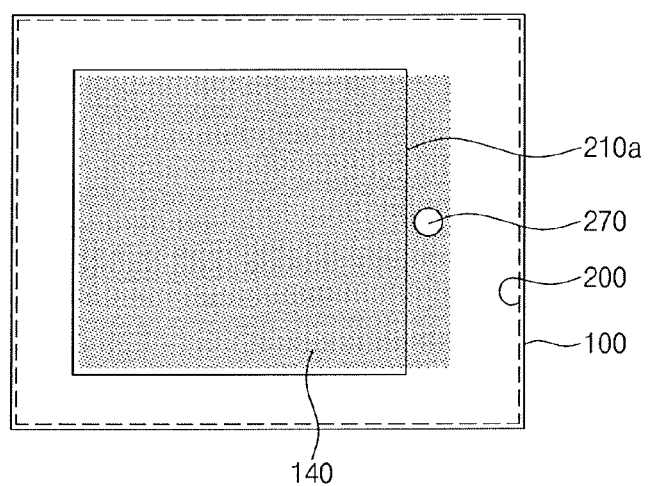

In another example, as shown in FIG. 6F, the ground metal plate 140 may have a size or area greater than that of the upper substrate 210a overlapped with the peripheral region 100. For example, the ground metal plate 140 may be overlapped with not only the entire area of the upper substrate 210a but also at least a portion of the ground plug 270, when viewed in a plan view.

As described with reference to FIGS. 6B through 6E, the ground metal plate 140 may have a size or area greater than that of an overlap region of the upper substrate 210a overlapped with the peripheral region 100. As another example, even if the upper substrate 210a is partially overlapped with the peripheral region 100, the ground metal plate 140 may be provided to have a size or area substantially equal to or greater than the upper substrate 210a.

Figure 7A:
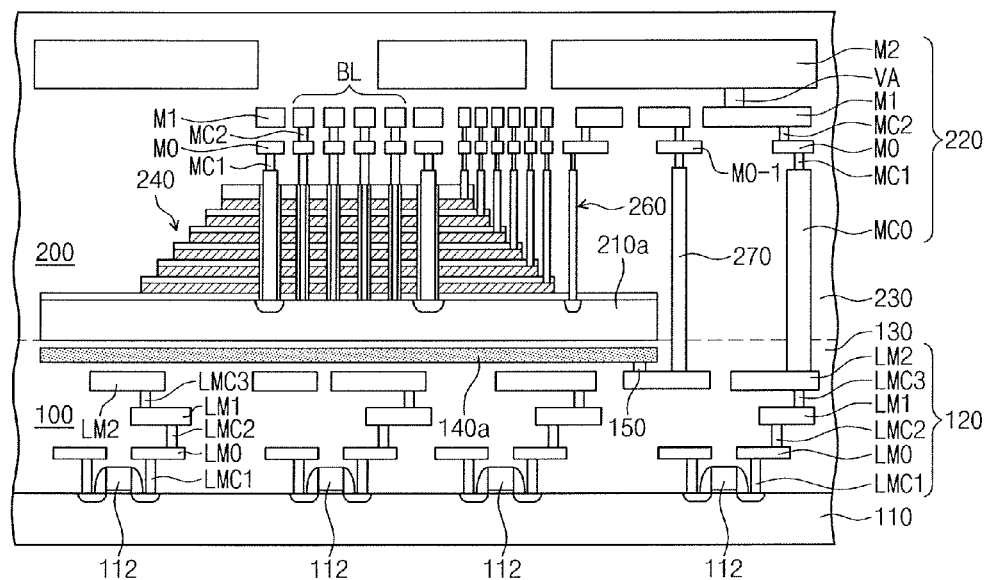
FIGS. 7A through 7C are sectional views illustrating modifications of FIG. 6A.
Figure 7B:
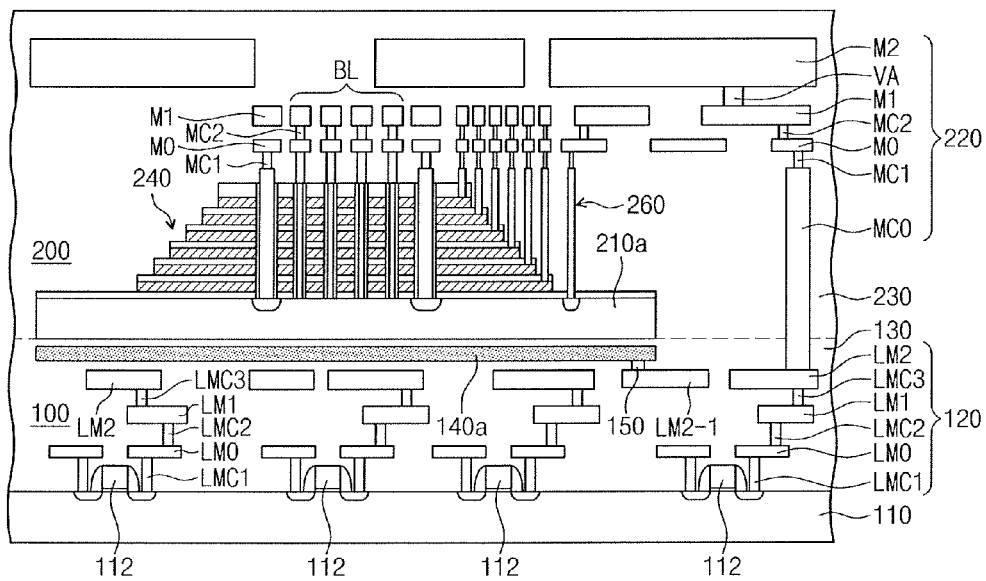
Figure 7C:
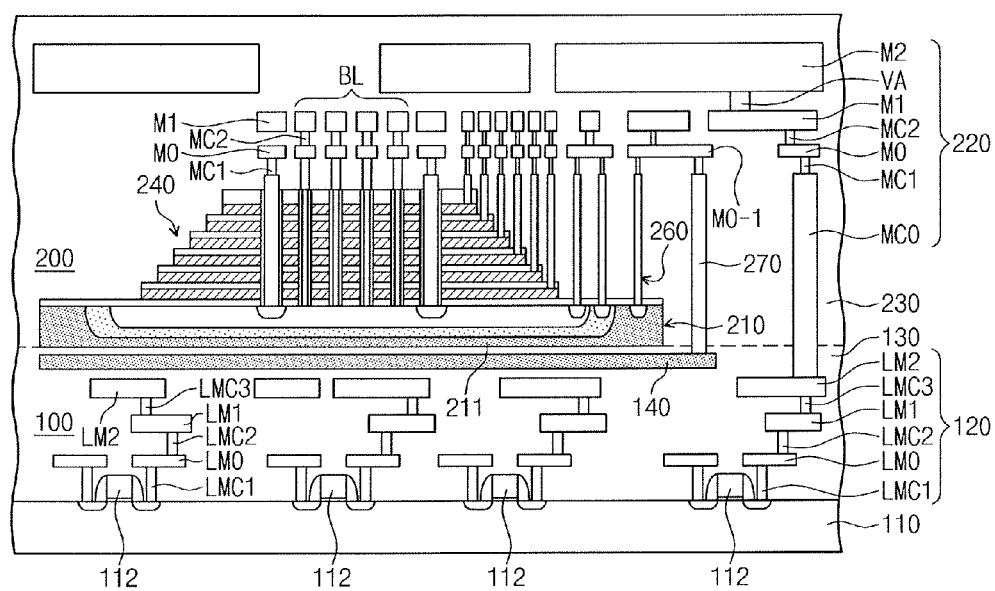

FIGS. 7A through 7C are sectional views illustrating modifications of the semiconductor device of FIG. 6A including configurations to electrically connect to the metal plate 140a from either connecting elements in the peripheral region 100 or connecting elements in the cell region 200.

Referring to FIG. 7A, similar to the semiconductor device 60 of FIG. 6A, a semiconductor device 70 having a COP structure in which the cell region 200 with the cell array 240 is stacked on the peripheral region 100 is provided. Hereinafter, unless otherwise specified, the above description for the semiconductor device 60 may be applied to the semiconductor device 70 in the same manner.

According to the present embodiment, a ground metal plate 140a that is shaped and dimensioned to be the same or smaller than the boundary of the upper substrate 210a. For example, the ground metal plate 140a may have the same shape as one of the ground metal plates 140 of FIGS. 6B through 6E, but from which the protrusion 142 is removed. Alternatively, the ground metal plate 140a may be provided to have a reduced size or area, compared with the ground metal plates 140 of FIGS. 6B through 6E.

The ground metal plate 140a may be electrically connected to a metal line, which is one of the peripheral circuit wiring 120 or the connection circuit wiring 220, and to which a ground signal is applied, through a connection plug 150. A connection plug 150 may be connected to a bottom surface of the ground metal plate 140a facing the upper metal line LM2 of the peripheral region 100.

As an example, the connection plug 150 may be connected to the ground plug 270 through at least one of the upper metal lines LM2, and thus, the ground metal plate 140a may be applied with the ground signal transmitted through the ground line M0-1.

As another example, as shown in FIG. 7B, the connection plug 150 may be electrically connected to a ground line LM2-1, which is one of the upper metal lines LM2 and to which a ground signal is applied, and thus, the ground signal may be transmitted to the ground metal plate 140a through the ground line LM2-1.

Referring to FIG. 7C, similar to the semiconductor device 60 of FIG. 6A, a semiconductor device 80 may be provided in a COP structure, in which the cell region 200 with the cell array 240 is stacked on the peripheral region 100.

The semiconductor device 80 may include the upper substrate 210 provided with a well structure. The upper substrate 210 may include the base substrate 211, to which a ground signal may be applied, as shown in FIG. 1B. According to an embodiment of the inventive concept, when a voltage (e.g., an erase voltage) for operating the cell array 240 is applied to the pocket well 213 and the deep well 212, the ground voltage may be applied to the base substrate 211 and the ground metal plate 140. The base substrate 211 and the ground metal plate 140 may be electrically connected in common to the ground line M0-1.

FIGS. 8A through 8F are sectional views illustrating a method of fabricating a semiconductor device according to example embodiments of the inventive concept.

Figure 8A:
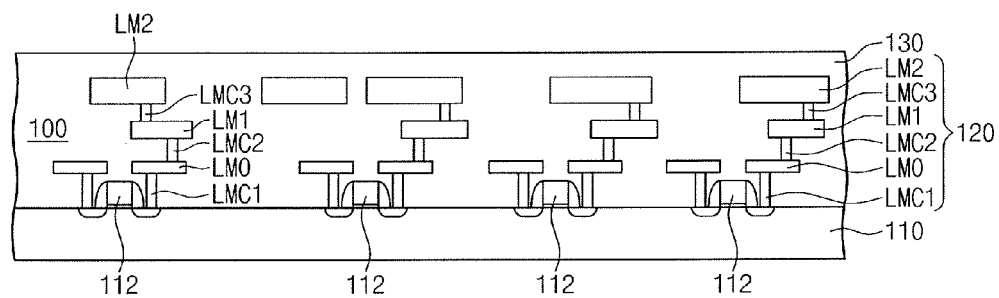
FIGS. 8A through 8F are sectional views illustrating a method of fabricating a semiconductor device according to an example embodiment of the inventive concept.

Referring to FIG. 8A, the peripheral region 100 may be formed on the lower substrate 110 (e.g., a silicon wafer). The formation of the peripheral region 100 may include forming the peripheral transistor 112, forming the peripheral circuit wiring 120 electrically connected to the peripheral transistor 112, and forming the lower insulating layer 130 to cover the peripheral transistor 112 and the peripheral circuit wiring 120. The peripheral circuit wiring 120 may be formed to have the same or similar structure as that described with reference to FIG. 1A, and thus, a detailed description thereof will be omitted.

Figure 8B:
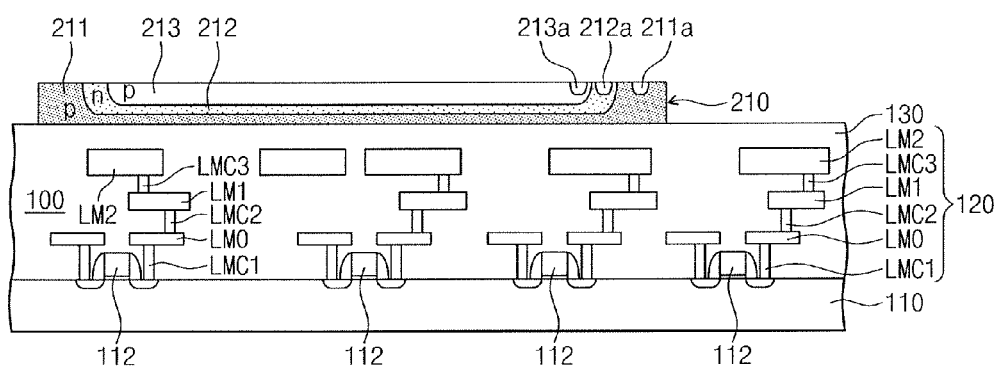

Referring to FIG. 8B, the upper substrate 210 provided with a well structure may be formed on the peripheral region 100. For example, the base substrate 211 may be formed by depositing a doped poly-silicon layer with a first conductivity type (e.g., p-type) or by depositing a poly-silicon layer and doping it with impurities of the first conductivity type (e.g., p-type). Thereafter, the deep well 212 may be formed by doping a portion of the base substrate 211 with impurities of a second conductivity type (e.g., n-type), and the pocket well 213 may be formed by doping a portion of the deep well 212 with impurities of the first conductivity type (e.g., p-type).

Furthermore, the substrate junction region 211a, which has a doping concentration higher than that of the base substrate 211 and has the first conductivity type (e.g., p-type), may be formed in the base substrate 211. Similarly, the main junction region 213a, which has a doping concentration higher than that of the pocket well 213 and has the first conductivity type (e.g., p-type), may be formed in the pocket well 213, and the sub junction region 212a, which has a doping concentration higher than that of the deep well 212 and has the second conductivity type (e.g., n-type), may be formed in the deep well 212.

The upper substrate 210 may be formed to be overlapped with at least a portion of the peripheral region 100, when viewed in a plan view. As another example, the upper substrate 210 may be shaped and dimensioned to vertically overlap the entire region of the peripheral region 100, when viewed in a plan view.

Figure 8C:
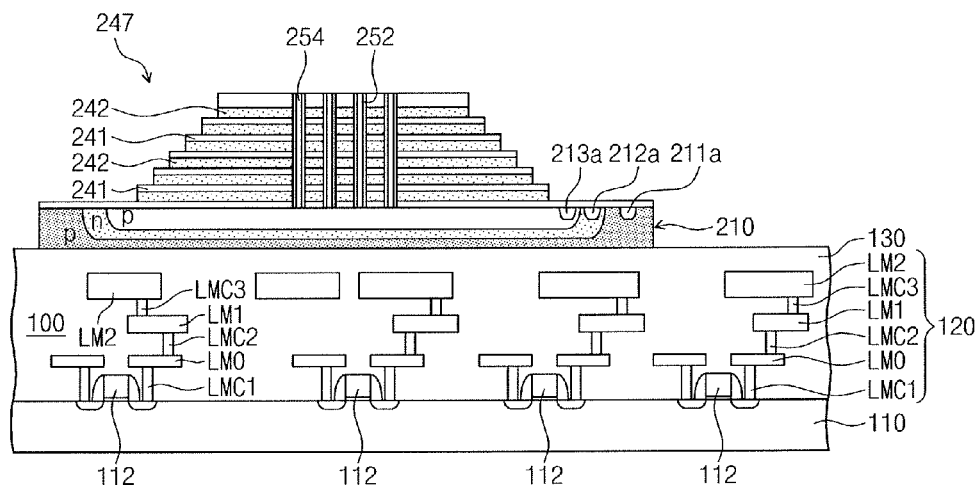

Referring to FIG. 8C, a mold stack 247, in which insulating layers 241 and sacrificial layers 242 are stacked one on top of another in a stepwise manner, may be formed on the pocket well 213 of the upper substrate 210, and the vertical channel 254 may be formed to penetrate the mold stack 247. The vertical channel 254 may be enclosed by the memory layer 252 and may be electrically connected to the pocket well 213.

Figure 8D:
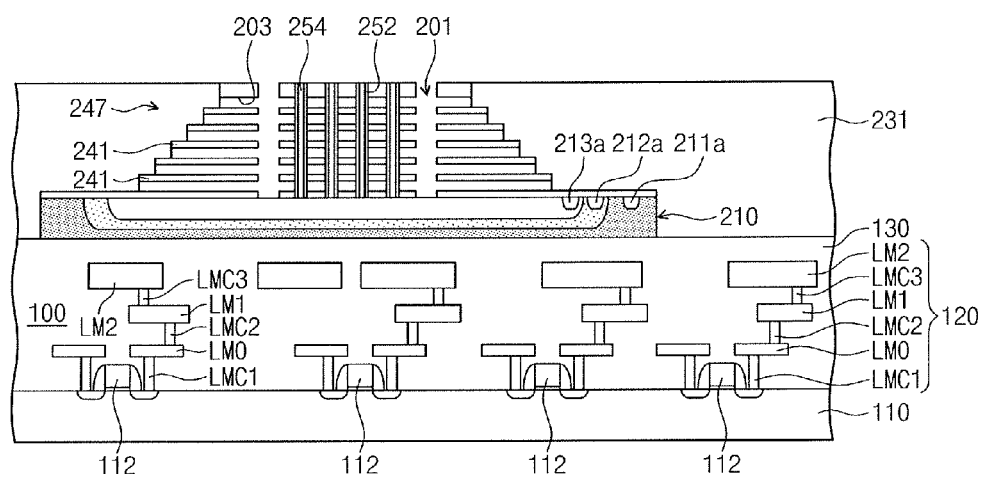

Referring to FIG. 8D, an insulating layer 231 may be deposited on the upper substrate 210, and a trench 201 may be formed to vertically penetrate the mold stack 247 and expose the pocket well 213. The sacrificial layers 242 may be removed using etchant supplied through the trench 201, thereby forming spaces 203.

Figure 8E:
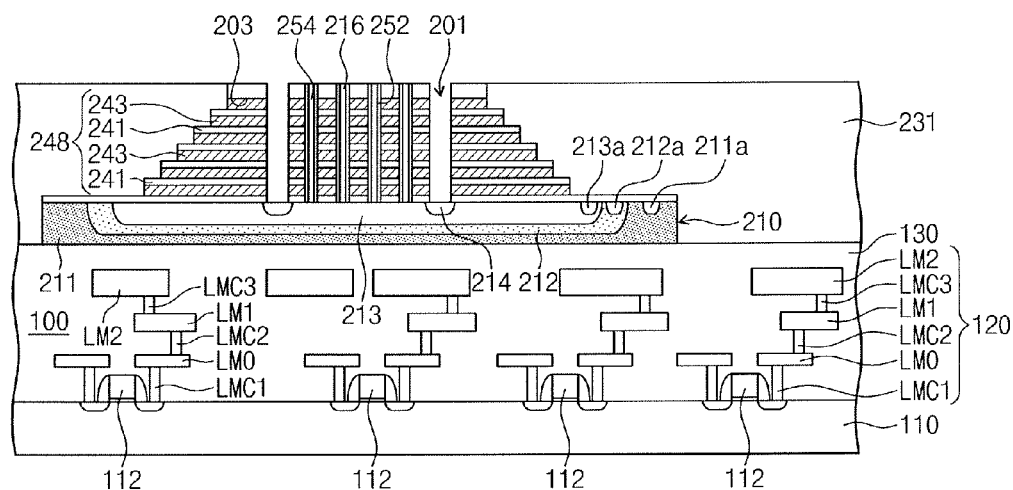

Referring to FIG. 8E, the spaces 203 may be filled with a conductive layer to form the gate stack 248 including the gates 243 vertically stacked along the vertical channel 254. The lowermost one of the gates 243 may be used as a part of the ground selection line GSL, the uppermost one of the gates 243 may be used as a part of the string selection line SSL, and the others of the gates 243 may be used as the word lines WL.

The pocket well 213 exposed by the trench 201 may be doped with impurities of the second conductivity type (e.g., n-type) to form the common source 214 constituting the common source line CSL. The drain electrode of the second conductivity type (e.g., n-type) may be formed in or on a top portion of the vertical channel 254.

Figure 8F:
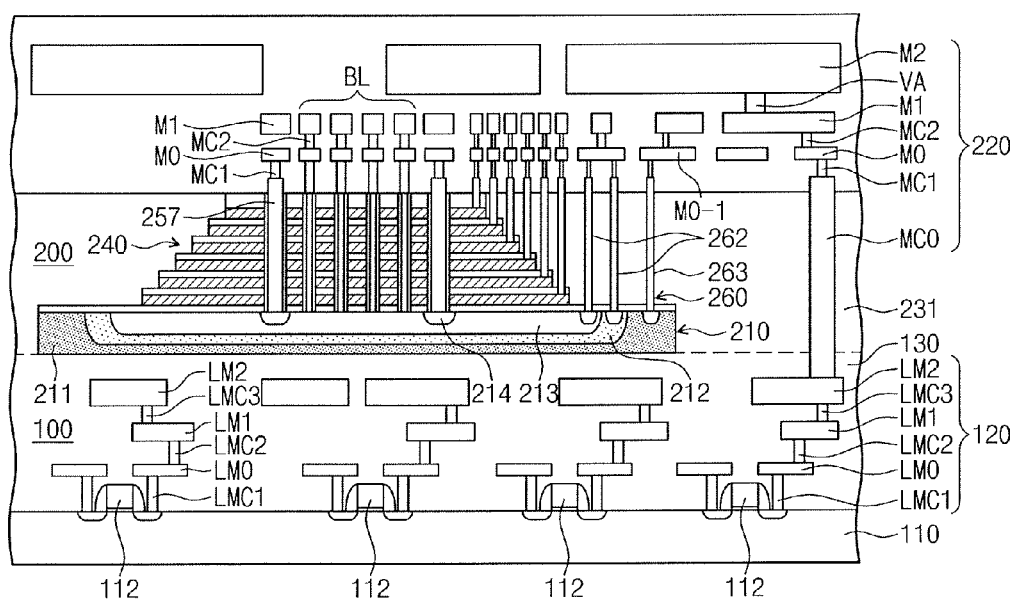

Referring to FIG. 8F, the common source plug 257 connected to the common source 214 may be formed. As a result, a VNAND type of the cell array 240 may be formed on the upper substrate 210. The metal contact 260 may be formed to be electrically connected to the cell array 240 and the upper substrate 210, the connection circuit wiring 220 may be formed to connect the cell array 240 to the peripheral circuit wiring 120, and an insulating layer 232 may be formed to cover the connection circuit wiring 220. The connection circuit wiring 220 may be formed to have the same or similar structure as that described with reference to FIG. 1A, and thus, a detailed description thereof will be omitted.

By applying the above processes, the semiconductor device 10 having a cell-on-peripheral (COP) structure including the cell region 200 stacked on the peripheral region 100 may be formed. The metal contact 260 may include the second metal plugs 262 electrically connected to the pocket well 213 and the deep well 212 and the third metal plugs 263 electrically connected to the base substrate 211, and the number and positions of the second and third metal plugs 262 and 263 may be variously modified, as previously described with reference to FIGS. 1A to 1D, 2A to 2D, 3A to 3D, and 4A to 4D.

The cell array 340 of FIG. 5B may be formed on the upper substrate 210, instead of the cell array 240, and in this case, the semiconductor device 50 of FIG. 5A may be fabricated. As shown in FIG. 5B, the cell array 340 may be formed by a method similar to that for the cell array 240, except for steps of forming the "U"-shaped channel 354 and forming the gate 345 on the "U"-shaped channel 354. Here, the gate 345 may constitute a source line.

The formation of the peripheral region 100 may further include forming the ground metal plate 140. Further, the upper substrate 210 may be formed of a bulk poly-silicon layer having the first conductivity type (e.g., p-type). In this case, the semiconductor device 70 of FIG. 7A or FIG. 7B may be fabricated. The ground metal plate 140 may be formed on the peripheral region 100, and the well structure may be formed in the upper substrate 210. In this case, the semiconductor device 80 of FIG. 7C may be fabricated.

Figure 9A:
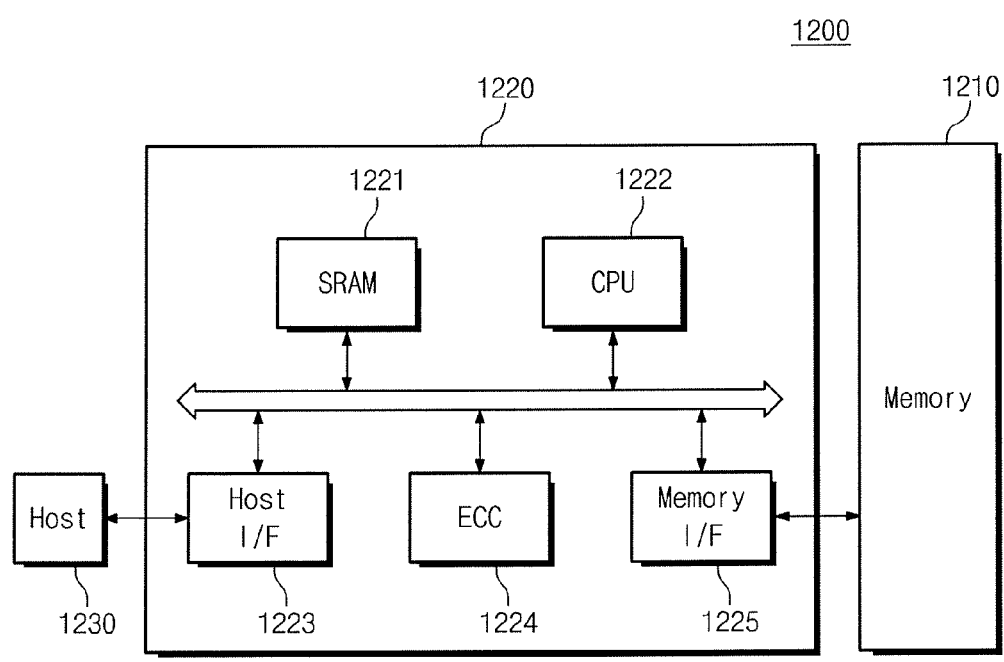
FIG. 9A is a schematic block diagram illustrating an example of a memory card including a semiconductor device according to example embodiments of the inventive concept.
Figure 9B:
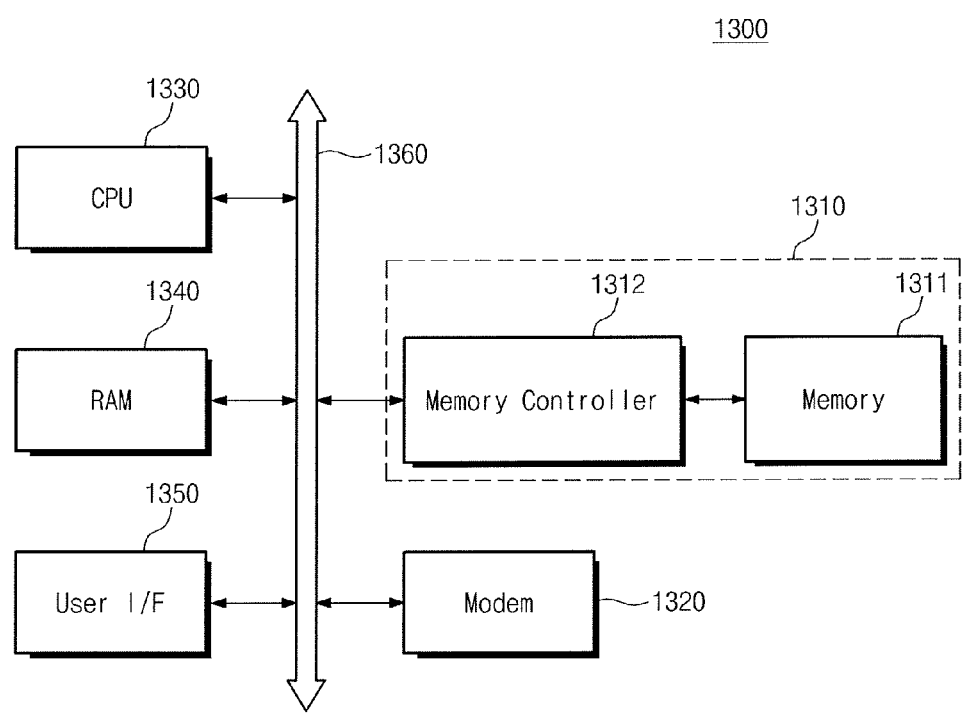
FIG. 9B is a schematic block diagram illustrating an example of an information processing system including a semiconductor device according to example embodiments of the inventive concept.

FIG. 9A is a schematic block diagram illustrating an example of a memory card including a semiconductor device according to example embodiments of the inventive concept. FIG. 9B is a schematic block diagram illustrating an example of an information processing system including a semiconductor device according to example embodiments of the inventive concept.

Referring to FIG. 9A, a memory card 1200 may include a memory controller 1220 controlling general data exchanges between a host 1230 and a memory device 1210. The memory 1210 may include at least one of the semiconductor devices 10-80 according to example embodiments of the inventive concept.

A static random access memory (SRAM) 1221 may be used as an operating memory of a processing unit 1222. A host interface 1223 may include a data exchange protocol of the host 1230 connected to the memory card 1200. An error correction code block 1224 may detect and correct errors included in data read from the memory device 1210. A memory interface 1225 may interface with the memory device 1210. The processing unit 1222 may perform general control operations for data exchange of the memory controller 1220.

Referring to FIG. 9B, an information processing system 1300 may include a memory system 1310, in which at least one of the semiconductor devices 10-80 according to example embodiments of the inventive concept is provided. The information processing system 1300 may be, for example, a mobile device and/or a desktop computer.

The information processing system 1300 may further include a modem 1320, a central processing unit (CPU) 1330, a random access memory (RAM) 1340, and a user interface 1350, electrically connected to the memory system 1310 through a system bus 1360. The memory system 1310 may include a memory 1311 and a memory controller 1312. The memory controller 1312 may be configured substantially identical to the memory card 1200 described with respect to FIG. 9A. Data processed by the central processing unit 1330 and/or input from the outside may be stored in the memory system 1310.

The information processing system 1300 may be configured to serve as one of memory cards, solid state drives (SSDs), camera image sensors, application chipsets, or the like.

According to example embodiments of the inventive concept, a substrate of a cell region may be formed to have a well structure, and at least a portion of the well structure (e.g., adjacent to a peripheral region) may be configured to be in a ground state. According to other example embodiments of the inventive concept, the peripheral region may include a ground metal plate, which is provided adjacent to the substrate of the cell region, and the ground metal plate may be applied with a ground signal. Such a grounded portion (e.g., the well or ground metal plate) between the cell and peripheral regions suppresses or prevents the substrate of the cell region from being electrically coupled with a metal line of the peripheral region.

It is to be understood that the foregoing is illustrative of the present inventive concept and is not to be construed as limited to the specific exemplary embodiments disclosed, and that modifications to the disclosed exemplary embodiments, as well as other embodiments, are intended to be included within the scope of the appended claims. For example, a VNAND type nonvolatile memory device is described for the embodiments above but other memory devices are equally applicable. In another example, an erase operation requiring a relatively high (erase) voltage applied to the upper region is described for the embodiments but the inventive concept is applicable to operation of devices having a COP structure wherein a higher voltage is applied to the upper region relative to voltages applied to the lower region of the semiconductor device.

Therefore, while example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a cell-on-peripheral structure including a peripheral region and a cell region stacked thereon, wherein the peripheral region comprises a lower substrate, a peripheral circuit provided on the lower substrate, and a peripheral metal line electrically connected to the peripheral circuit,
wherein the cell region comprises an upper substrate and the cell region overlaps the peripheral circuit, wherein the upper substrate includes a base substrate encompassing junction regions electrically connected to circuits in the cell region; and
a grounding structure disposed between the base substrate and the peripheral metal line, the grounding structure providing an electrical ground during a memory cell erase operation.

2. The device of claim 1, wherein during the memory cell erase operation, a higher voltage is applied to the upper substrate than a voltage applied to the peripheral circuit.

3. The device of claim 1, wherein the grounding structure is a well structure encompassing the base substrate.

4. The device of claim 3, wherein the well structure includes a first well encompassing the base substrate and a second well encompassing the first well.

5. The device of claim 3, wherein the base substrate is a polysilicon layer doped with a first connectivity type, and the well structure includes at least one polysilicon layer doped with a second connectivity type.

6. The device of claim 4, wherein the base substrate is a polysilicon layer doped with a first connectivity type, and the first well is a polysilicon layer doped with a second connectivity type, and the second well is a polysilicon layer doped with the first connectivity type.

7. The device of claim 1, wherein the grounding structure is connected to ground via a plug.

8. The device of claim 1, wherein the grounding structure is a metal plate.

9. The device of claim 8, wherein the metal plate overlaps the entire cell region.

10. The device of claim 8, wherein the metal plate partially overlaps the cell region.

11. The device of claim 8, wherein the metal plate partially overlaps the cell region and overlaps the entire peripheral circuit.

12. The device of claim 1, wherein the cell region includes a 3D memory cell.

13. The device of claim 3, wherein the junction regions in the base substrate and the junctions regions in the well structure are connected to metal lines via plugs.

14. The device of claim 13, wherein a higher voltage is applied to at least one junction region in the base substrate, and a ground voltage is applied to at least one junction region in the well structure.

15. The device of claim 13, further including a gate stack disposed on the base substrate, wherein the junction regions in the base substrate are disposed spaced apart and outside of opposing sides of the gate stack when viewed from above the gate stack toward the base substrate.

16. The device of claim 15, wherein the junction regions in the base substrate are connected to a metal line via respective plugs extending vertically from the junction regions.

17. The device of claim 8, wherein the metal plate is connected to a metal line in the cell region.

18. The device of claim 8, wherein the metal plate is connected to a metal line in the peripheral region.

19. The device of claim 1, wherein the cell region includes a vertical-type NAND memory device.

20. The device of claim 1, wherein a ground signal is selectively applied to the grounding structure to provide the electrical ground.

21. A semiconductor device, comprising:
a cell-on-peripheral structure including a peripheral region and a cell region stacked thereon, wherein the peripheral region comprises a lower substrate, a peripheral circuit provided on the lower substrate, and a peripheral metal line electrically connected to the peripheral circuit, wherein the cell region comprises an upper substrate and the cell region overlaps the peripheral circuit, wherein the upper substrate includes a base substrate encompassing junction regions electrically connected to circuits in the cell region; and
a grounding structure disposed between the base substrate and the peripheral metal line, the grounding structure provides an electrical ground during a memory operation.

22. The device of claim 21, wherein the memory operation is a cell erase operation, and a higher voltage is applied to the upper substrate than a voltage applied to the peripheral circuit.

23. The device of claim 21, wherein the grounding structure is a well structure encompassing the base substrate.

24. The device of claim 23, wherein the well structure includes a first well encompassing the base substrate and a second well encompassing the first well.

25. The device of claim 23, wherein the base substrate is a polysilicon layer doped with a first connectivity type, and the well structure includes at least one polysilicon layer doped with a second connectivity type.

26. The device of claim 24, wherein the base substrate is a polysilicon layer doped with a first connectivity type, and the first well is a polysilicon layer doped with a second connectivity type, and the second well is a polysilicon layer doped with the first connectivity type.

27. The device of claim 21, wherein the grounding structure is connected to ground via a plug.

28. The device of claim 21, wherein the grounding structure is a metal plate.

29. The device of claim 28, wherein the metal plate overlaps the entire cell region.

30. The device of claim 28, wherein the metal plate partially overlaps the cell region.

31. The device of claim 28, wherein the metal plate partially overlaps the cell region and overlaps the entire peripheral circuit.

32. The device of claim 21, wherein the cell region includes a 3D memory cell.

33. The device of claim 21, wherein the memory operation requires a higher voltage applied to the upper substrate than a voltage applied to the peripheral circuit.

34. The device of claim 21, wherein the electrical ground is selectively provided during the memory operation by application of a grounding signal to the grounding structure during the memory operation.

35. A method of operating a semiconductor device having a cell-on-peripheral structure including a peripheral region and a cell region stacked thereon, wherein the peripheral region comprises a lower substrate, a peripheral circuit provided on the lower substrate, and a peripheral metal line electrically connected to the peripheral circuit,
wherein the cell region comprises an upper substrate and the cell region overlaps the peripheral circuit, wherein the upper substrate includes a base substrate encompassing junction regions electrically connected to circuits in the cell region, comprising: applying a ground to a grounding structure disposed between the base substrate and the peripheral metal line, and applying a first voltage to the base substrate and a second voltage to the peripheral circuit during a memory operation, wherein the first voltage is higher relative to the second voltage.

36. The method of claim 35, wherein the ground is applied to the base substrate when a grounding signal is selectively applied to the grounding structure.

37. The method of claim 35, wherein the memory operation is a cell erase operation.

38. A method of fabricating a semiconductor device, the method comprising:
providing a peripheral region including a lower substrate and a peripheral circuit thereon;
providing on the peripheral region a cell region including an upper substrate and a cell array; and
forming a ground pattern between the cell region and the peripheral region,
wherein the ground pattern is selectively applied with a ground signal to connect to ground during a memory operation.

39. The method of claim 38, wherein the providing of the cell region comprises:
forming a semiconductor layer of a first conductivity type on the peripheral region;
doping a portion of the semiconductor layer with impurities having a second conductivity type different from the first conductivity type to form a deep well in the semiconductor layer; and
doping a portion of the deep well with impurities having the first conductivity type to form a pocket well in the deep well,
wherein the pocket well is enclosed by the deep well, thereby being disconnected from the semiconductor layer, and
the semiconductor layer disconnected from the pocket well by the deep well serves as the ground pattern.

40. The method of claim 39, wherein the providing of the cell region further comprises:
doping a portion of the pocket well, which is positioned outside a side edge of the cell array, with impurities having the first conductivity type to form a first junction region having a doping concentration higher than that of the pocket well;
doping a portion of the semiconductor layer, which is positioned outside the side edge of the cell array, with impurities having the first conductivity type to form a second junction region having a doping concentration higher than that of the semiconductor layer;
forming a first plug coupled to the first junction region and electrically connected to the pocket well; and
forming a second plug coupled to the second junction region and electrically connected to the semiconductor layer.

41. The method of claim 39, wherein the providing of the cell region further comprises:
doping a portion of the deep well, which is positioned outside an side edge of the cell array, with impurities having the second conductivity type to form a third junction region having a doping concentration higher than that of the deep well; and
forming a third plug coupled to the third junction region and electrically connected to the deep well.

* * * * *